(12) United States Patent
Dodoc

(10) Patent No.: US 8,780,441 B2
(45) Date of Patent: Jul. 15, 2014

(54) CATADIOPTRIC PROJECTION OBJECTIVE WITH PUPIL CORRECTION

(75) Inventor: Aurelian Dodoc, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/226,615

(22) Filed: Sep. 7, 2011

(65) Prior Publication Data

US 2012/0002273 A1    Jan. 5, 2012

Related U.S. Application Data

(60) Division of application No. 12/511,515, filed on Jul. 29, 2009, now abandoned, which is a continuation of application No. PCT/EP2007/001708, filed on Feb. 28, 2007.

(51) Int. Cl.
*G02B 17/00* (2006.01)
*G02B 17/08* (2006.01)

(52) U.S. Cl.
CPC ........... *G02B 17/0816* (2013.01); *G02B 17/08* (2013.01); *G02B 17/00* (2013.01)
USPC ............................. 359/365; 359/727; 359/730

(58) Field of Classification Search
USPC .................. 359/364–366, 729–733, 850–861
See application file for complete search history.

(56) References Cited

U.S. PATENT DOCUMENTS

| | | | |
|---|---|---|---|
| 4,714,307 A | 12/1987 | Palmer | |
| 6,894,834 B2 * | 5/2005 | Mann et al. | 359/366 |
| 6,995,833 B2 | 2/2006 | Kato et al. | |
| 2003/0011755 A1 | 1/2003 | Omura et al. | |
| 2003/0234912 A1 | 12/2003 | Omura | |
| 2004/0233405 A1 | 11/2004 | Kato et al. | |
| 2005/0190435 A1 | 9/2005 | Shafer et al. | |
| 2006/0061879 A1 | 3/2006 | Terasawa et al. | |
| 2006/0119750 A1 | 6/2006 | Epple et al. | |
| 2006/0198028 A1 * | 9/2006 | Ulrich et al. | 359/648 |
| 2006/0238883 A1 | 10/2006 | Terasawa et al. | |
| 2007/0268474 A1 | 11/2007 | Omura et al. | |
| 2008/0037112 A1 | 2/2008 | Ulrich et al. | |

FOREIGN PATENT DOCUMENTS

| | | |
|---|---|---|
| DE | 10 2005 045862 | 4/2006 |
| EP | 1191378 | 3/2002 |
| EP | 1 336 887 | 8/2003 |
| JP | 2002-277742 | 9/2002 |

(Continued)

OTHER PUBLICATIONS

The Japanese Office Action, with English translation, for corresponding JP Appl No. 2009-551916, dated May 1, 2012.

(Continued)

*Primary Examiner* — Thong Nguyen

(74) *Attorney, Agent, or Firm* — Fish & Richardson P.C.

(57) ABSTRACT

The disclosure provides a catadioptric projection objective which includes a plurality of optical elements, including first, second and third refractive objection parts. Optical elements arranged between an object surface and a first pupil surface form a Fourier lens group that includes a negative lens group arranged optically close to the first pupil surface. The Fourier lens group is configured such that a Petzval radius $R_P$ at the first pupil surface satisfies the condition: $|R_P|>150$ mm.

17 Claims, 16 Drawing Sheets

(56) References Cited

FOREIGN PATENT DOCUMENTS

| JP | 2003-297729 | 10/2003 |
| JP | 2006-245085 | 9/2006 |
| WO | WO 01/65296 | 2/2001 |
| WO | WO 2005/111689 | 11/2005 |
| WO | WO 2005/119369 | 12/2005 |
| WO | WO 2006/005547 | 1/2006 |
| WO | WO 2007/025643 | 3/2007 |
| WO | WO 2007/031544 | 3/2007 |

OTHER PUBLICATIONS

The International Search Report and a Written Opinion from the counterpart PCT Application No. PCT/EP2007/001708, filed Feb. 28, 2007.
The International Preliminary Report on Patentability and Written Opinion from the counterpart PCT Application No. PCT/EP2007/001708, dated Sep. 1, 2009.
Japanese Office Action, with translation thereof, for corresponding JP Appl No. 2012-240860, dated Oct. 18, 2013.

* cited by examiner

CATADIOPTRIC PROJECTION OBJECTIVE WITH PUPIL CORRECTION

CROSS-REFERENCE TO RELATED APPLICATION

This application is a divisional of U.S. application Ser. No. 12/511,515, filed Jul. 29, 2009, now abandoned, which is a continuation of, and claims benefit under 35 USC 120 to, international application PCT/EP2007/001708, filed Feb. 28, 2007. The contents of these applications are hereby incorporated by reference in their entirety.

FIELD

The disclosure relates to a catadioptric projection objective including a plurality of optical elements arranged to image an off-axis object field arranged in an object surface of the projection objective onto an off-axis image field arranged in an image surface of the projection objective.

BACKGROUND

Catadioptric projection objectives are employed, for example, in projection exposure systems, in particular wafer scanners or wafer steppers, used for fabricating semiconductor devices and other types of microdevices and serve to project patterns on photomasks or reticles, hereinafter referred to generically as "masks" or "reticles," onto an object having a photosensitive coating with ultrahigh resolution on a reduced scale.

SUMMARY

In some embodiments, the disclosure provides a catadioptric projection objective for microlithography suitable for use in the vacuum ultraviolet (VUV) range, where correction of imaging aberrations for different field points is facilitated. In certain embodiments, field dependent variations are largely avoided upon correction of imaging aberrations.

In some embodiments, the disclosure provides a catadioptric projection objective that includes a plurality of optical elements arranged to image an off-axis object field arranged in an object surface onto an off-axis image field arranged in an image surface of the projection objective. The optical elements form: a first, refractive objective part that can generate a first intermediate image from radiation coming from the object surface and including a first pupil surface; a second objective part including at least one concave mirror that can image the first intermediate image into a second intermediate image and including a second pupil surface optically conjugated to the first pupil surface; and a third objective part that can image the second intermediate image onto the image surface and including a third pupil surface optically conjugated to the first and second pupil surface. Optical elements arranged between the object surface and the first pupil surface form a Fourier lens group that includes a negative lens group arranged optically close to the first pupil surface.

The correction status of the first pupil surface can be influenced in a targeted manner to provide a first pupil surface having a surface curvature substantially weaker (radius of curvature substantially larger) than in certain known systems. A corrected pupil image is desirable to avoid field variations of correction effects induced by correcting elements positioned at the pupil position. Field curvature is generally the main aberration of the image of the entrance pupil to the first pupil surface. In order to correct the pupil image, a mechanism for correcting field curvature is desirably positioned in the objective part upstream the pupil surface.

A specific distribution of refractive power within the Fourier lens group can be provided to influence the pupil imaging which images the entrance pupil of the projection objective into the first pupil surface. Overall positive refractive power is involved for the Fourier lens group to collect radiation having a relatively large object-side numerical aperture into a beam passing through the first pupil surface. An undercorrection of the first pupil surface with regard to image curvature is thereby produced. Providing a negative lens group optically close to the first pupil surface may at least partly counteract the overall effect of the Fourier lens group on the curvature of the first pupil surface and provides a "flattening effect" on the curvature of the first pupil surface.

If it is often desired to effect a correction of aberrations essentially constant for all field points one or more correction elements may be placed in or optically close to a pupil surface. A variation of correcting effects across the field is also dependent on the path of ray bundles from different field points near the pupil surface. In case of large differences a correction element placed at or close to the pupil surface may have a field-dependent correcting effect. Even where a correction status of a pupil surface is relatively good, there is still a dependency from the angles of incidence of different rays at the pupil surface for different field points. It may be desirable to improve the correction status of the pupil surface. In particular, this can provide a mechanism to reduce the curvature of the first pupil surface.

Although it may be possible to provide at least one (weak) positive lens between the negative lens group and the pupil surface, the flattening effect may be improved where the negative lens group is arranged immediately upstream of the first pupil surface such that no positive lens is arranged between the negative lens group and the pupil surface.

Optionally, at least one negative lens of the negative lens group is arranged very close to or at the first pupil surface. Where negative refractive power is provided very close to or at the first pupil surface, the overall influence of this negative refractive power on the refractive power of the Fourier lens group is relatively small (due to a small value for the chief ray height, CRH), whereas at the same time the influence on correction of image field curvature of the pupil imaging may be relatively strong to provide the flattening effect on the curvature of the first pupil surface. In some embodiments, the negative lens group includes at least one negative lens arranged in a region where a marginal ray height MRH is substantially greater than a chief ray height CRH such that the condition |RHR|<0.2 is fulfilled for the ray height ratio RHR=CRH/MRH. Optionally, the condition |RHR|<0.1 holds.

In some embodiments, the negative lens group is formed by a single negative lens, whereby negative refractive power can be provided in an axially narrow space close to the first pupil surface. In certain embodiments, the negative lens group may be formed by two or more lenses including at least one negative lens, where the lenses in combination have negative refractive power.

In some embodiments, the negative lens group includes a biconcave negative lens immediately upstream of the first pupil surface, where the biconcave negative lens can be preceded by a positive lens upstream thereof such that the biconcave negative lens is the only lens of the negative lens group. A targeted concentration of negative refractive power close to the first pupil surface is thereby obtained.

In some embodiments, the Fourier lens group is configured such that a Petzval radius $R_P$ at the first pupil surface obeys the condition $|R_P|>150$ mm, which is relatively large compared to certain known systems having comparable object-side numerical aperture. The Petzval radius as used here corresponds to the radius of curvature of the first pupil surface. The Petzval radius is proportional to the reciprocal of the Petzval sum $1/R_P$ of the Fourier lens group. The Petzval radius may be significantly larger than that, such as larger than 200 mm or larger than 250 mm.

In some embodiments, an aperture stop is positioned at the first pupil surface. The aperture stop may have a variable diameter allowing to adjust the utilized image-side numerical aperture NA. The variable aperture stop may be designed as a planar aperture stop, because little or no significant influence on telecentricity will generally occur when the diameter of the aperture stop is changed at a relatively flat first pupil surface.

In some embodiments the Fourier lens group has a first positive lens group ("P") immediately following the object surface, a first negative lens group ("N") immediately following the first positive lens group, a second positive lens group immediately following the first negative lens group, and a second negative lens group immediately following the second positive lens group and arranged optically close to the first pupil surface. Such Fourier lens group therefore includes two subsequent lens combinations of type P-N. A beneficial distribution of correcting effect for different aberrations, such as spherical aberration of the first pupil surface, astigmatism and field curvature may be obtained in this structure.

In some embodiments, the Fourier lens group has been improved with respect to lens material consumption and correcting effect by providing that the Fourier lens group includes at least one aspheric surface optically close to the object surface where $RHR>|0.5|$ and at least one aspheric surface optically close to the first pupil surface where $|RHR|<0.2$. Optionally, at least one aspheric surface is provided in an intermediate region between the object surface and the first pupil surface in a region where the condition $0.2<|RHR|<|0.5|$ applies. The aspheric surface in the intermediate region may be provided in addition to the aspheric surfaces close to the field surface (object surface) and the first pupil surface.

In some embodiments, the third objective part is largely responsible for providing the high image-side numerical aperture provides significant contribution to correction of spherical aberration and coma of the imaging process. The third objective part, which can be purely refractive, may include between the third pupil surface and the image surface in his order: a front positive lens group; a zone lens having negative refractive power at least in a peripheral zone around an optical axis; and a rear positive lens group including a last optical element of the projection objective immediately upstream of the image surface.

The zone lens may have positive refractive power in a central zone around the optical axis. The zone lens may be designed as an aspheric lens configured to provide a negative refractive effect which increases from a central zone to a peripheral zone of the negative zone lens. In some embodiments, the zone lens is a meniscus lens having a concave surface facing the object surface. The zone lens may be arranged immediately upstream of the last optical element.

These features of the third lens group may be beneficial independent of the type of optical design and of the design of the first lens group in different projection objectives having a final imaging subsystem to image a final intermediate image onto the image surface.

Different types of projection objectives may be used. In some embodiments, the catadioptric projection objective is designed as an "in-line-system" i.e. as a catadioptric projection objective having one straight (unfolded) optical axis common to all optical elements of the projection objective. From an optical point of view, in-line systems may be favorable since optical problems caused by utilizing planer folding mirrors, such as polarization effects, can largely be avoided. Also from a manufacturing point of view, in-line systems may be designed such that conventional mounting techniques for optical elements can be utilized, thereby improving mechanical stability, of the projection objective.

In some embodiments, the second objective part has a mirror group having an object-side mirror group entry for receiving radiation coming from the object surface and an image-side mirror group exit for exiting radiation emerging from the mirror group exit towards the image surface, where the mirror group includes an even number of concave mirrors. In some embodiments, the second objective part has exactly two concave mirrors. The second objective part may be catadioptric (including at least one transparent lens in addition to at least one concave mirror) or catoptric (having only mirrors). In some embodiments capable of providing an obscuration free imaging without vignetting at very high image-side numerical apertures NA>1 all concave mirrors of the mirror group are optically remote from a pupil surface.

In certain embodiments, the second objective part has exactly one concave mirror positioned at or optically close to the pupil surface of the second objective part, and one or more negative lenses arranged ahead of the concave mirror in a region of relatively large marginal ray heights in order to correct axial chromatic aberration (CHL) and contribute to Petzval sum correction ("Schupmann principle"). The projection objective may include a first planar folding mirror (deflecting mirror) tilted relative to the optical axis to deflect radiation coming from the optical surface towards the concave mirror or to deflect radiation coming from the concave mirror towards the image surface. A second planar folding mirror optically downstream of the first planar folding mirror may be provided and oriented at right angles to the first folding mirror to allow parallel orientation of object surface and image surface. Representative examples of folded catadioptric projection objective using planar folding mirrors in combination with a single concave mirror are disclosed, for example, in US 2003/0234912 A1 or US 2004/0233405 A1 or WO 2005/111689 A2 or U.S. Pat. No. 6,995,833 B2. The disclosure of these documents related to the general layout of these systems is incorporated herein by reference.

The previous and other properties can be seen not only in the claims but also in the description and the drawings, wherein individual characteristics may be used either alone or in sub-combinations as embodiments of the disclosure and in other areas and may individually represent advantageous and patentable embodiments.

DETAILED DESCRIPTION

In the following description, the term "optical axis" refers to a straight line or a sequence of straight-line segments passing through the centers of curvature of the optical elements. The optical axis can be folded by folding mirrors (deflecting mirrors). In the case of the examples presented here, the object is a mask (reticle) bearing the pattern of a layer of an integrated circuit or some other pattern, for example, a grating pattern. The image of the object is projected onto a wafer serving as a substrate that is coated with a layer of photoresist, although other types of substrates, such as components of liquid-crystal displays or substrates for optical gratings, are also feasible.

Where tables are provided to disclose the specification of a design shown in a figure, the table or tables are designated by the same numbers as the respective figures. Corresponding features in the figures are designated with like or identical reference identifications to facilitate understanding. Where lenses are designated, an identification L3-2 denotes the second lens in the third objective part (when viewed in the light propagation direction).

Figure 1:
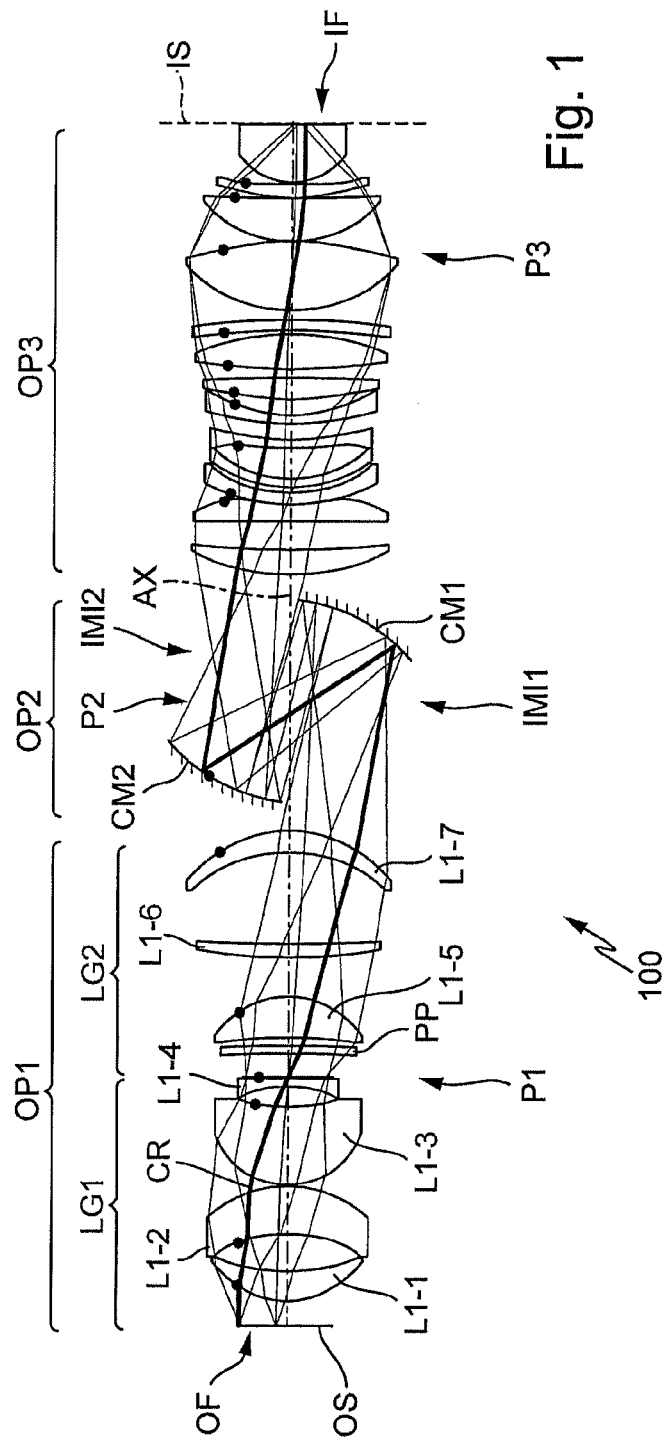
FIG. 1 is a meridional section of a projection objective.

FIG. 1 shows a catadioptric projection objective 100 designed for ca. λ≈193 nm UV operating wavelength. It is designed to project an image of a pattern on a reticle arranged in the planar object surface OS (object plane) into the planar image surface IS (image plane) on a reduced scale, for example, 4:1, while creating exactly two real intermediate images IMI1, IMI2. The effective object field OF and image field IF are off-axis, i.e. entirely outside the optical axis AX. A first refractive objective part OP1 is designed for imaging the pattern in the object surface into the first intermediate image IMI1 at an enlarged scale. A second, catoptric (purely reflective) objective part OP2 images the first intermediate image IMI1 into the second intermediate image IMI2 at a magnification close to 1:1. A third, refractive objective part OP3 images the second intermediate image IMI2 onto the image surface IS with a strong reduction ratio.

The path of the chief ray CR of an outer field point of the off-axis object field OF is drawn bold in FIG. 1 in order to facilitate following the beam path of the projection beam. For the purpose of this application, the term "chief ray" (also known as principal ray) denotes a ray running from an outermost field point (farthest away from the optical axis) of the effectively used object field OF to the center of the entrance pupil. Due to the rotational symmetry of the system the chief ray may be chosen from an equivalent field point in the meridional plane as shown in the figures for demonstration purposes. In projection objectives being essentially telecentric on the object side, the chief ray emanates from the object surface parallel or at a very small angle with respect to the optical axis. The imaging process is further characterized by the trajectory of marginal rays. A "marginal ray" as used herein is a ray running from an axial object field point (field point on the optical axis) to the edge of an aperture stop. That marginal ray may not contribute to image formation due to vignetting when an off-axis effective object field is used. The chief ray and marginal ray are chosen to characterize optical properties of the projection objectives. The radial distances between such selected rays and the optical axis at a given axial position are denoted as "chief ray height" (CRH) and "marginal ray height" (MRH), respectively.

Three mutually conjugated pupil surfaces P1, P2 and P3 are formed at positions where the chief ray CR intersects the optical axis. A first pupil surface P1 is formed in the first objective part between object surface and first intermediate image, a second pupil surface P2 is formed in the second objective part between first and second intermediate image, and a third pupil surface P3 is formed in the third objective part between second intermediate image and the image surface IS.

The second objective part OP2 includes a first concave mirror CM1 having the concave mirror surface facing the object side, and a second concave mirror CM2 having the concave mirror surface facing the image side. The mirror surfaces are both continuous or unbroken, i.e. they do not have a hole or bore in the area used for reflection. The mirror surfaces facing each other define a catadioptric cavity, which is also denoted intermirror space, enclosed by the curved surfaces defined by the concave mirrors. The intermediate images IMI1, IMI2 are both situated inside the catadioptric cavity well apart from the mirror surfaces.

Objective 100 is rotational symmetric and has one straight optical axis AX common to all refractive and reflective optical components ("In-line system"). There are no folding mirrors. An even number of reflections occurs. Object surface and image surface are parallel. There is no image flip. The concave mirrors have small diameters allowing to bring them close together and rather close to the intermediate images lying in between. The concave mirrors are both constructed and illuminated as off-axis sections of axial symmetric surfaces. The light beam passes by the edges of the concave mirrors facing the optical axis without vignetting. Both concave mirrors are positioned optically remote from a pupil surface rather close to the next intermediate image. The objective has an unobscured circular pupil centered around the optical axis thus allowing use as projection objectives for microlithography.

The projection objective 100 is designed as an immersion objective for λ=193 nm having an image side numerical aperture NA=1.55 when used in conjunction with a high index immersion fluid between the exit surface of the objective and the image surface. The projection objective is designed for a rectangular 26 mm*5.5 mm image field and is corrected for a design object field having object field radius (object height) 63.7 mm.

The specification for this design is summarized in Table 1. The leftmost column lists the number of the refractive, reflective, or otherwise designated surface, the second column lists the radius, r, of curvature of that surface [mm], the third column indicates aspheric surfaces "AS". The fourth column lists the distance, d [mm], between a surface and the next surface, a parameter that is referred to as the "thickness" of the optical element, the fifth column lists the material employed for fabricating that optical element, and the sixth column lists the refractive index of the material employed for its fabrication. The seventh column lists the optically utilizable, clear, semi diameter [mm] (optically free radius) of the optical component. A radius of curvature r=0 in a table designates a planar surface (having infinite radius).

A number of surfaces (indicated AS) are aspherical surfaces. Table 1A lists the associated data for those aspherical surfaces, from which the sagitta or rising height p(h) of their surface figures as a function of the height h may be computed employing the following equation:

$$p(h)=[((1/r)h^2)/(1+SQRT(1-(1+K)(1/r)^2h^2))]+C1 \cdot h^4 + C2 \cdot h^6 + \ldots,$$

where the reciprocal value (1/r) of the radius is the curvature of the surface in question at the surface vertex and h is the distance of a point thereon from the optical axis. The sagitta or rising height p(h) thus represents the distance of that point from the vertex of the surface in question, measured along the z-direction, i.e., along the optical axis. The constants K, C1, C2, etc., are listed in Table 1A.

First objective part OP1 imaging the (rectangular) effective object field OF into the first intermediate image IMI1 may be subdivided into a first lens group LG1 with overall positive refractive power between object surface and first pupil surface P1, and a second lens group LG2 with overall positive refractive power between first pupil surface P1 and the first intermediate image IMI1. First lens group LG1 is designed to image the telecentric entrance pupil of the projection objective into first pupil surface P1, thereby acting in the manner of a Fourier lens group performing a single Fourier transformation.

The first lens group includes, in this order from the object surface, an positive meniscus lens L1-1 with object-side convex aspheric surface, a positive meniscus lens L1-2 with object-side concave aspheric surface, a thick positive meniscus lens L1-3 with image-side concave aspheric surface and a biconcave negative lens L1-4 aspheric on the exit surface immediately upstream of the first pupil surface.

Negative lens L1-4 forms a negative lens group positioned optically close to the first pupil surface P1 at a position where the condition RHR<0.2 applies for the ray height ratio RHR=CRH/MRH.

A transparent plane parallel plate PP may optionally be positioned close to the first pupil surface P1. The plane parallel plate PP may be provided with one or two aspheric surfaces to act as a correcting element. Due to the position close to the pupil surface, any correcting effect of the parallel plate PP has essentially the same influence on all ray bundles originating from different field points such that little or no field variation of the correcting effect is obtained (essentially field-constant correcting effect).

The correcting element can be mounted in such a way it can be exchanged without removing the objective from the projection exposure system, and can be replaced by another correcting element, having another shape adapted to correct aberrations. Alternatively, or in addition, the correcting element may be configured to be moved or tilted relative to the nearest pupil position or other lenses in the optical system, enhancing the correction capabilities.

The second lens group LG2 includes a positive meniscus lens L1-5 with aspheric convex exit surface immediately downstream of the first pupil surface, a thin positive meniscus lens L1-6 with image-side concave surface, and a thin positive meniscus lens L1-7 having an object-side concave surface and an aspheric exit surface lens immediately upstream of the first intermediate image.

The negative lens group, which is formed by a single biconcave negative lens L1-4 in this embodiment, is effective to counteract the effect on image field curvature provided by the positive lenses L1-1 to L1-3 upstream thereof, thereby flattening the first pupil surface P1 while, at the same time, contributing only little to the overall refractive power of the Fourier lens group LG1. Therefore, the pupil surface can be flattened without necessitating additional positive refractive power in the Fourier lens group to counteract the negative power of the negative lens. This may be understood by considering a system of thin lenses (representing the Fourier lens group LG1). The overall refractive power of this system may be described by:

$$\phi = \Sigma \omega_i \phi_i$$

where $\phi$ is the overall refractive power, $\phi_i$ is the refractive power of single lens with index i, and $\omega_i$ is the ratio $MRH_i/MRH_1$, where $MRH_i$ is the marginal ray height at lens i and $MRH_1$ is the marginal ray height at the first pupil surface.

The image field curvature may be described by the Petzval sum:

$$PTZ = \Sigma \phi_i/n_i = 0$$

where a value PTZ=0 represents an entirely flat (planar) surface.

According to these conditions the negative refractive power in a system desirably compensates the positive refractive power in order to correct for image field curvature. Obtaining a positive overall refractive power of the system involves a marginal ray height $MRH_i$ at the position of a negative lens or negative lenses that is smaller than the respective values at positive lenses. According to these conditions negative lenses at small marginal ray heights will typically compensate for image curvature effected by positive refractive power at larger marginal ray heights. The typical "belly-waist" structure of refractive projection objectives is a typical consequence following from these conditions. A negative lens group arranged close to an object surface or an image surface of an imaging system may be used to reduce image field curvature. Now consider the pupil imaging e.g. imaging the entrance pupil of the projection objective into the first pupil surface. In this pupil imaging the object (entrance pupil) is typically not accessible in telecentric systems since it is located almost at infinity. However, the image of the entrance pupil in the pupil imaging is the first pupil surface arranged in the optical system where the chief ray intersects the optical axis. Providing a negative lens group upstream of and close to that first pupil surface may be used to reduce the field curvature of the pupil imaging, i.e. may be used to flatten the first pupil surface.

Some beneficial effects of a negative lens group provided within the Fourier lens group optically close to the first pupil surface are now explained by comparing some relevant properties of the first embodiment shown in FIG. 1 with corresponding properties of a reference system REF shown in FIG.

2, where the reference system does not have the negative lens group. In the reference system REF, features and feature groups corresponding to respective features and feature groups of the embodiment of FIG. 1 are designated with the same reference identifications. Specifications of reference system REF are given in tables 2, 2A.

In order to illustrate the correction status of the projection objectives at various positions within the projection objective, use will be made of "field curve diagrams" and "spot diagrams". A field curve diagram is a diagram displaying the distance between the paraxial tangential image position or the paraxial sagittal image position and the image plane for each field height. A spot diagram is a diagram displaying the intersection points with the image plane of a bundle of rays emerging from a field point. In the spot diagrams, the geometrical RMS R size is given by the following equation:

$$RMS\ R = SQRT(\Sigma R_i^2)/k = SQRT(\Sigma (X_i-X_0)^2 (Y_i-Y_0)^2)/k$$

where Xi, Yi are the x and y coordinates of ray i at the image plane, k is the number of rays and X0, Y0 is the average position of the ray coordinates in the image surface.

Figure 2:
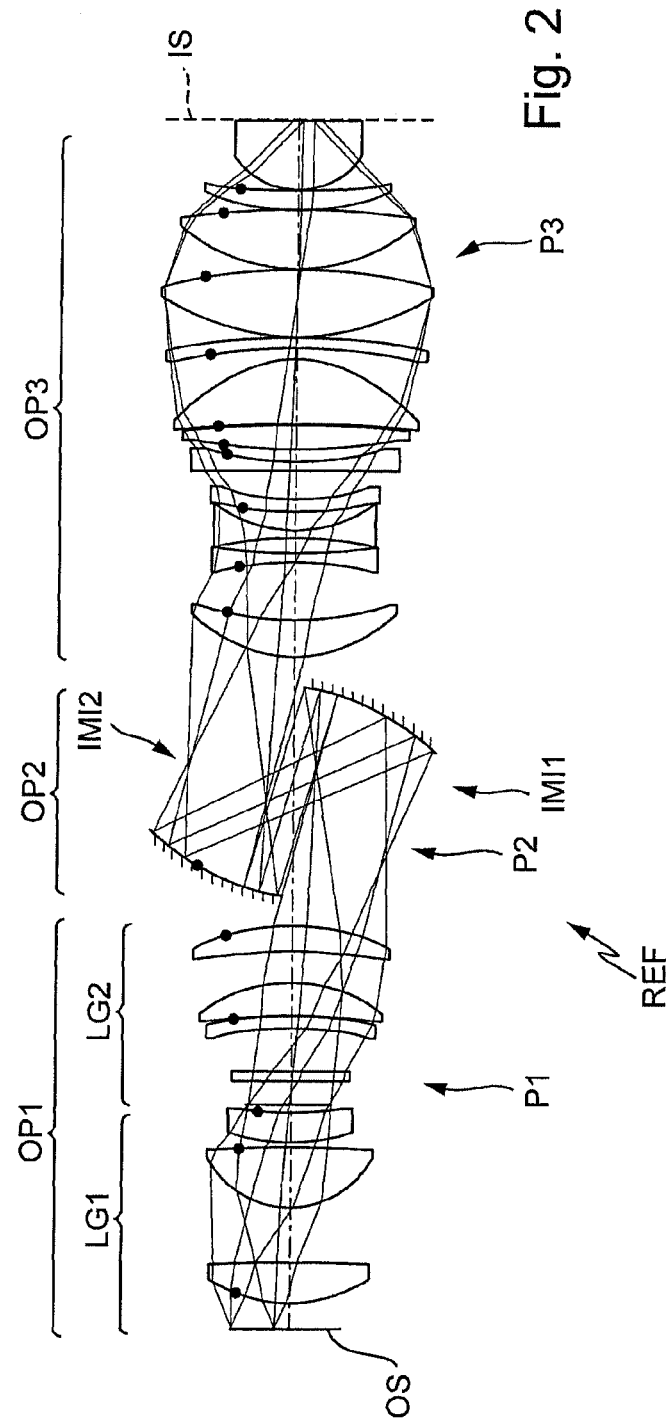
FIG. 2 is a meridional section of a reference projection objective.
Figure 3A:
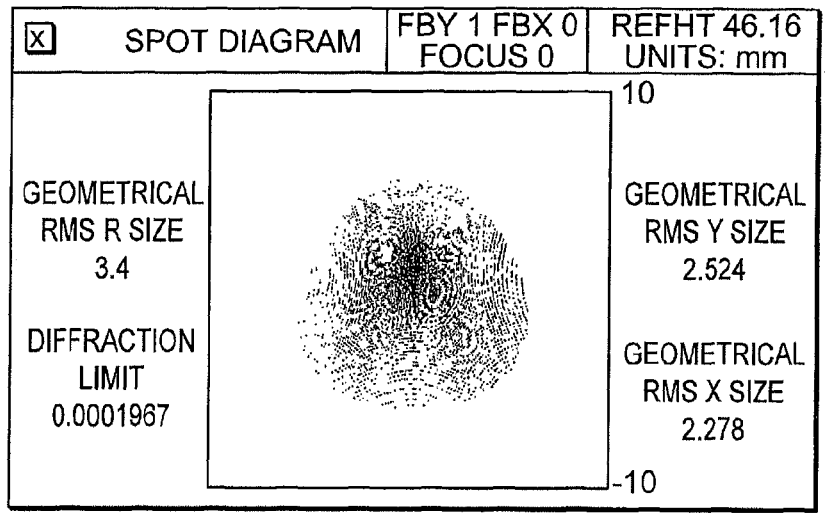
FIGS. 3A-3C show diagrams indicating the correction status of the first pupil surface of the reference system of FIG. 2.
Figure 3B:
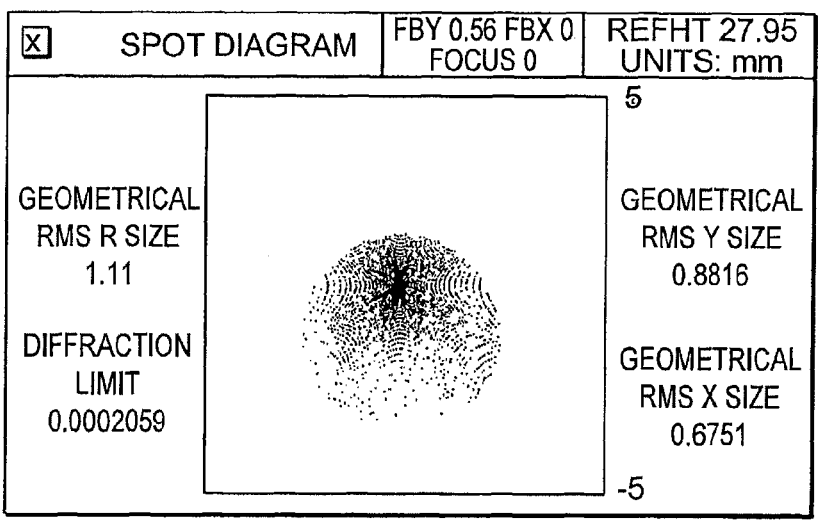
Figure 3C:
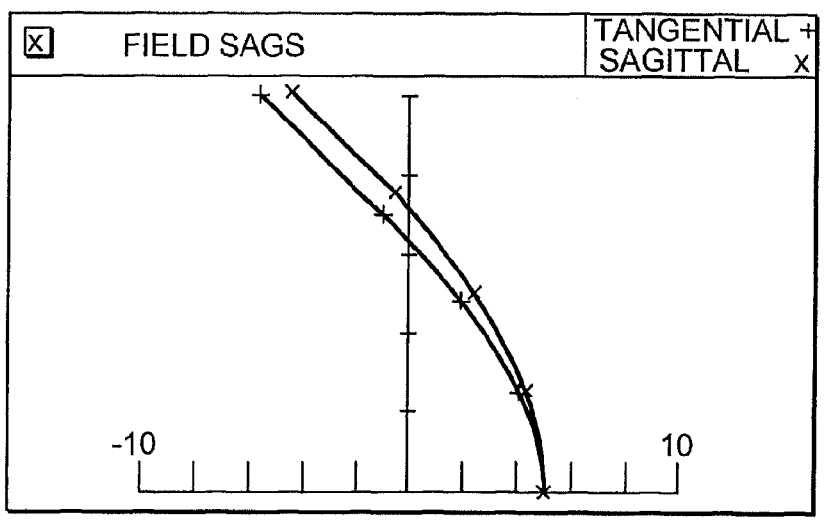
Figure 4A:
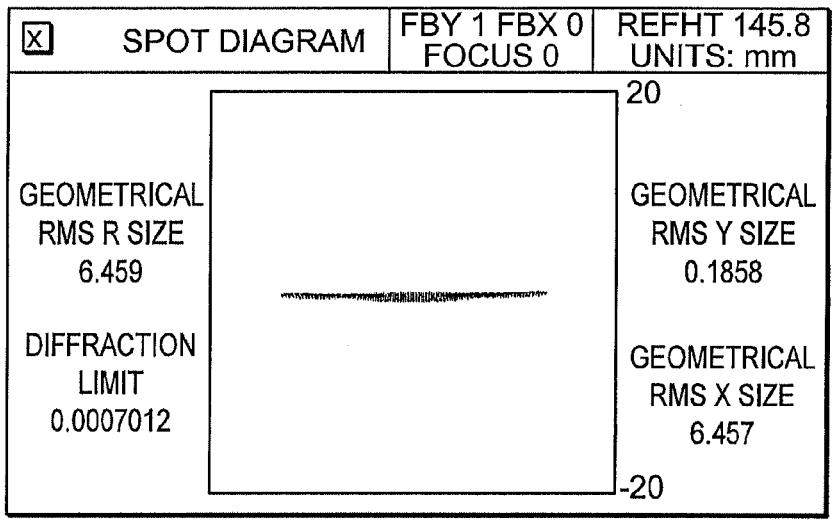
FIGS. 4A-4C show diagrams indicating the correction status of the third pupil surface of the reference system shown in FIG. 2.
Figure 4B:
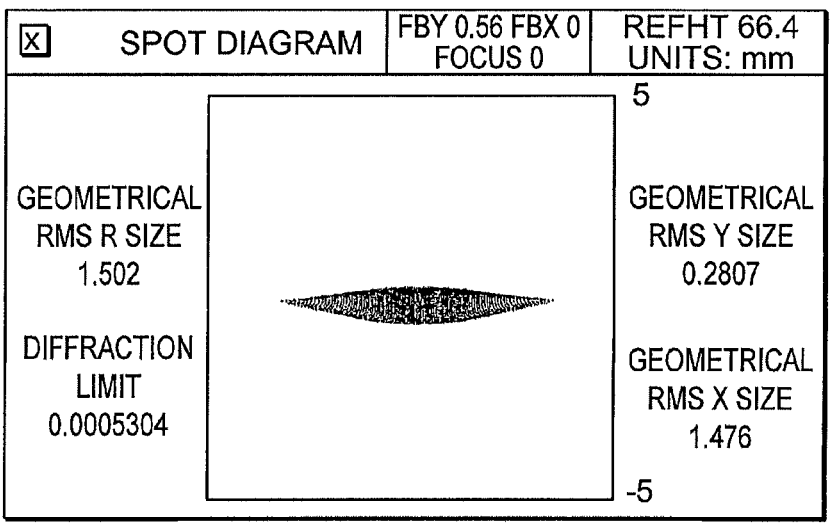
Figure 4C:
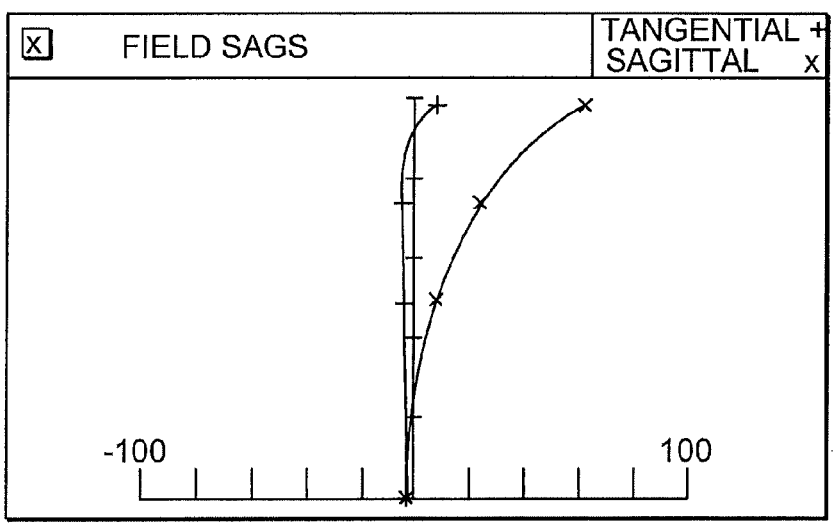

The correction status of the first pupil surface P1 of the reference system REF in FIG. 2 is shown using spot diagrams in FIG. 3A and FIG. 3B and field curves in FIG. 3C. A significant image-field curvature is evident. The correction status of the third pupil surface P3 (within the third objective part OP3) is shown using spot diagrams (FIGS. 4A, 4B) and a field curve diagram (FIG. 4C). The diagrams of FIGS. 4A-4C indicate a significant degree of astigmatism. A large difference between the correction status of the first pupil P1 and the third pupil P3 is also evident from a comparison of these figures.

The Petzval radius $R_P$ of the first lens group LG1 (Fourier lens group) performing the imaging of the entrance pupil onto the first pupil surface P1 is $R_P=-139$ mm. The image field curvature of the imaging of the third pupil is substantially overcorrected having a Petzval radius $R_P=+110$ mm. The last positive lens group between the third pupil P3 and the image surface IS is mainly responsible to provide the required image-side numerical aperture NA. Therefore, this lens group has strong positive refractive power. In the reference system, the image field curvature contribution provided by this lens group is difficult to compensate. A correction compromise is obtained by flattening the tangential shell, as evident from FIG. 4C.

In the following, third order aberrations refer to aberrations of the pupil image. The object of pupil imagery is the entrance pupil, which is assumed to be at infinity in object space.

The third order aberrations, represented by the Seidel aberration error sums SA3 (third order spherical aberration), CMA3 (third order coma), AST3 (third order astigmatism), PTZ3 (third order Petzval sum) and DIS3 (third order distortion) are as follows:

SA3=−3.279689 mm, CMA3=−0.693865 mm,
AST3=−0.811623 mm, PTZ3=−5.011397 mm
and DIS3=−6.331224 mm.

Figure 5A:
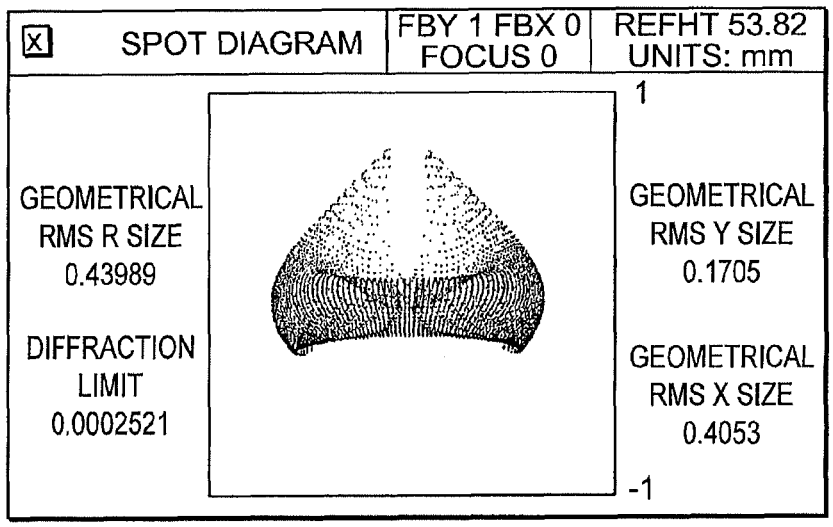
FIGS. 5A-5C show diagrams indicating the correction status of the first pupil surface in FIG. 1.
Figure 5B:
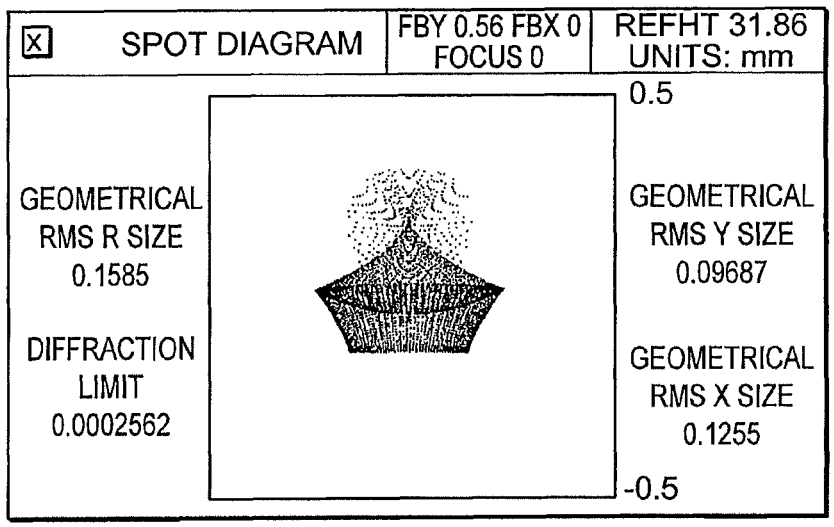
Figure 5C:
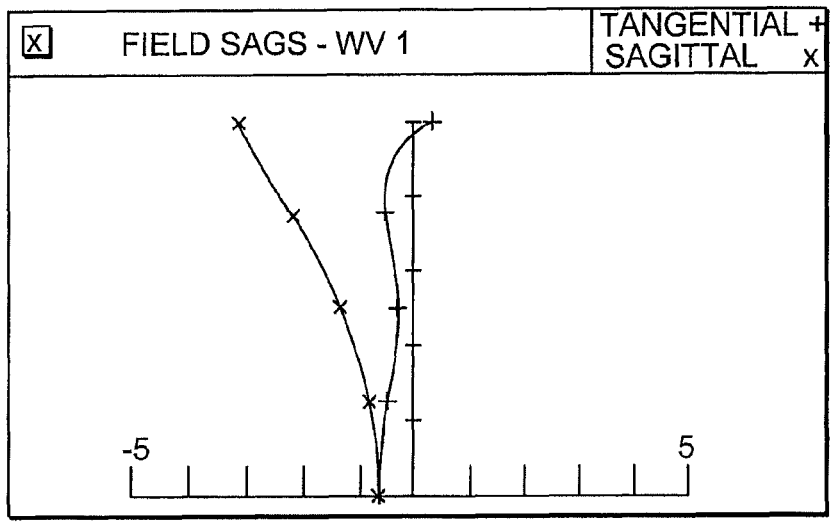

Significant improvements are obtained in the embodiment of FIG. 1, which includes negative lens group L1-4 immediately upstream of the first pupil surface. The correction status of the first pupil surface P1 is given in the spot diagrams in FIG. 5A and FIG. 5B and the field curves in FIG. 5C. The Seidel aberration sums are as follows:

SA3=1.087472, CMA3=0.083425, AST3=1.342253,
PTZ3=−2.642283 and DIS3=−2.242963.

It is evident that the spot size is significantly smaller than in the reference system (Note that scales differ by factor 10 between FIGS. 3A, 3B and FIGS. 5A, 5B). Further, the correction of tangential and sagittal shell is substantially improved (scales differ by factor 20 between FIGS. 3C and 5C). These data indicate a significantly improved correction status. The Petzval radius $R_P$ of the first pupil surface is $R_P=-290$ mm, which is a significant improvement when compared to the reference system ($R_P=-139$ mm).

Figure 6:
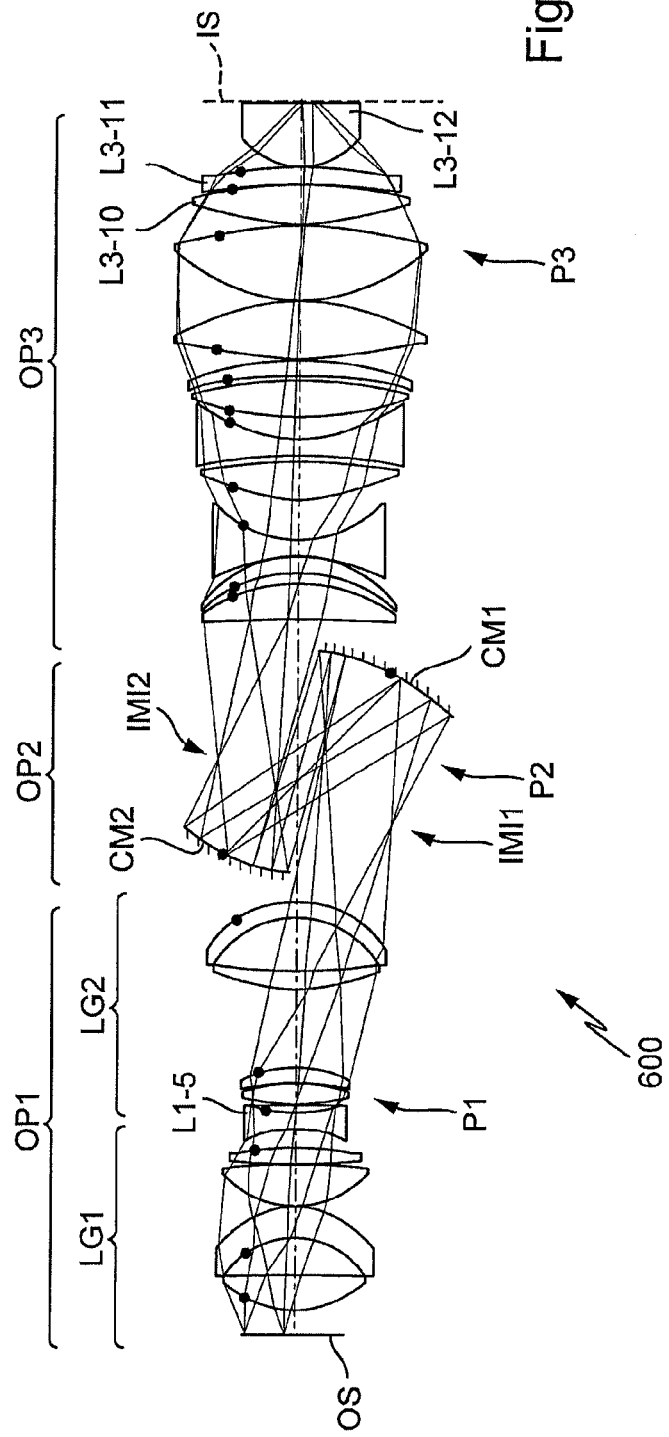
FIG. 6 shows a meridional section of a projection objective.

FIG. 6 shows a catadioptric projection objective 600 designed as an immersion objective for λ=248 nm having an image-side numerical aperture NA=1.47 when used in conjunction with a high index immersion fluid between the exit surface of the objective and the image surface. The projection objective is designed for a rectangular 26 mm×5.5 mm image field. At NA=1.47 a maximum ray angle in the immersion liquid is 72.65°, the ray angle being measured between the propagation direction of the ray having maximum inclination towards the optical axis, and the optical axis.

Figure 7:
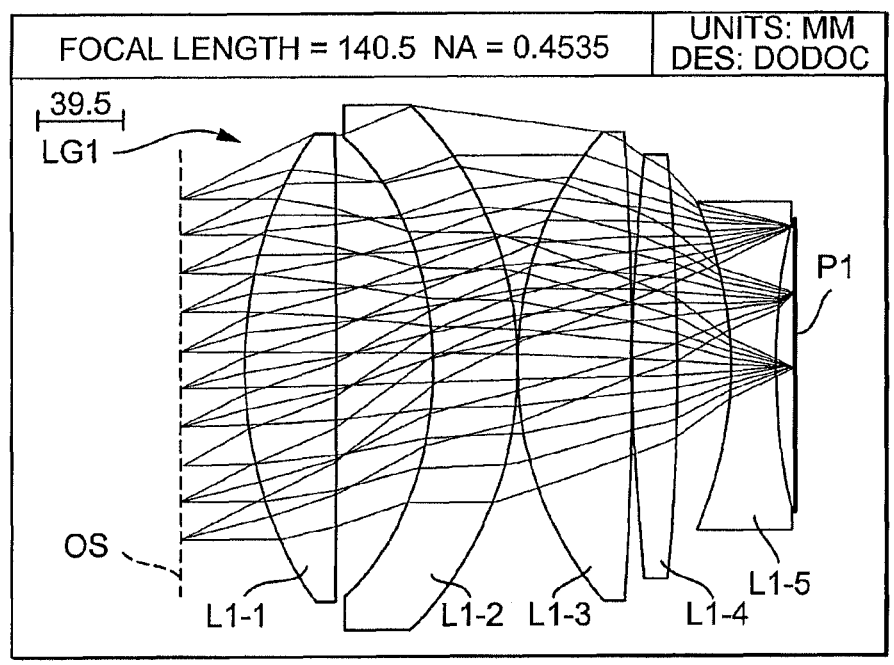
FIG. 7 shows an enlarged detail of the Fourier lens group LG1 of the projection objective in FIG. 6.

The sequence of objective parts and lens groups is the same as in FIG. 1, indicated by using the same reference identifications. The first lens group LG1 performing the Fourier transformation between the object surface OS and the first pupil surface P1 is shown in detail in FIG. 7. The specifications are given in Tables 6, 6A.

The first lens group LG1 includes, in this sequence from the object surface OS to the first pupil surface P1, a biconvex positive lens L1-1 having a strongly curved entry surface and an almost flat exit surface, a negative meniscus lens L1-2 having a concave entry surface facing the object surface, a biconvex positive lens L1-3, a thin positive lens L1-4 having a strongly aspheric exit surface providing positive refractive power around the optical axis and negative refractive power in a zone near the outer edge of the lens, and a negative group formed by a single biconcave negative lens L1-5 immediately upstream and very close to the first pupil surface P1. The structure of this lens group includes two lens combinations of type P-N, where P represents positive refractive power and N represents negative refractive power. The first lens combination P-N formed by lenses L1-1 and L1-2 provides a strong contribution to correction of spherical aberration of the pupil (PSA). Negative lens L1-5 contributes to correction of third order spherical aberration of the pupil (PSA3) and coma (CMA3). The second P-N combination formed by positive lenses L1-3 and L1-4 and negative lens L1-5 secures correction of astigmatism (AST3) and image field curvature (PTZ3). The contributions of the single lenses to third order Seidel aberrations are summarized in Table A.

TABLE A

| Lens | SA3 | CMA3 | AST3 | PTZ3 |
| --- | --- | --- | --- | --- |
| L1-1 | 0.525336 | −0.325503 | −2.799435 | −1.937709 |
| L1-2 | 1.798902 | −0.285417 | 0.416959 | 0.062927 |
| L1-3 | −1.755569 | 0.247167 | 1.457322 | −2.126689 |
| L1-4 | −1.05019 | −1.015048 | 0.872844 | −1.165997 |
| L1-5 | 0.907359 | 1.122079 | 0.492766 | 2.768379 |

Figure 8:
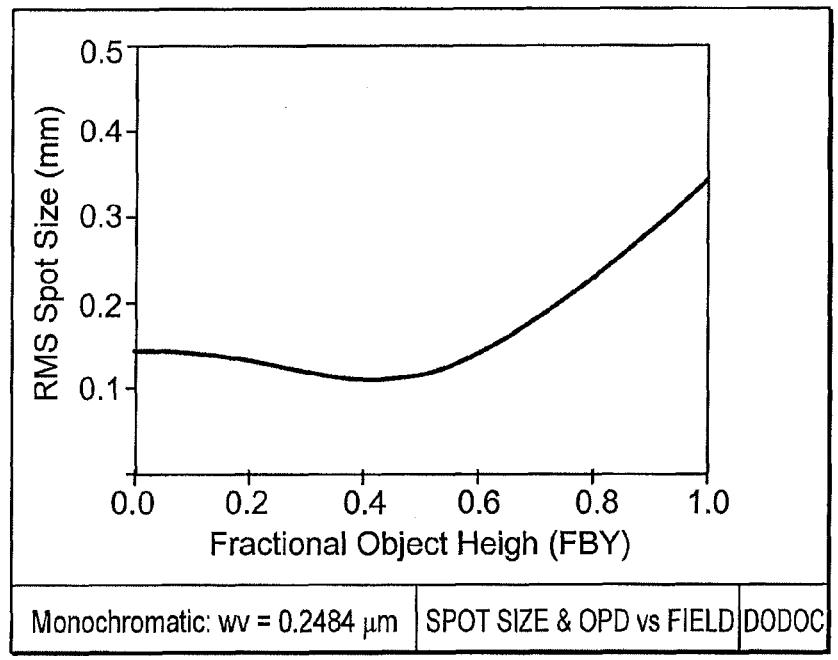
FIG. 8 shows a diagram representing the field variation of the RMS spot size of the projection objective in FIG. 6.
Figure 9:
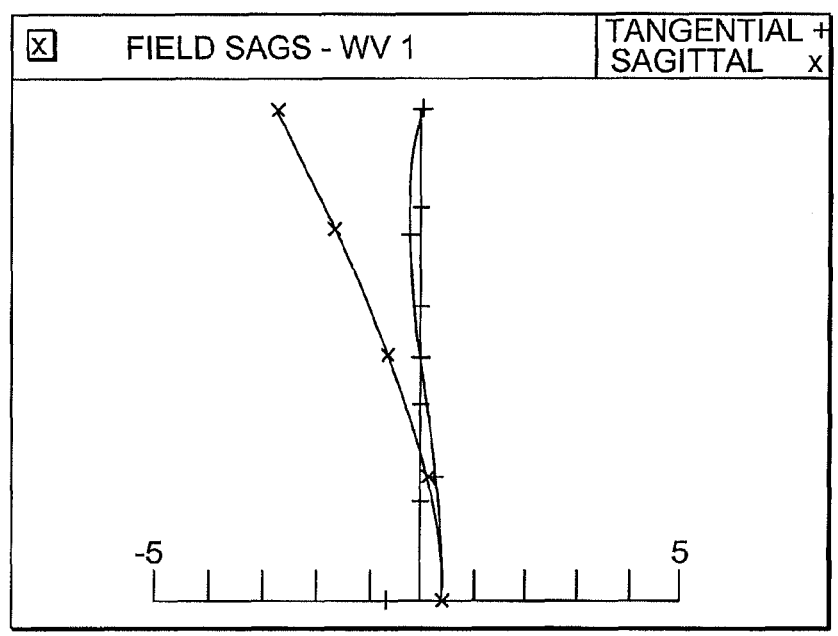
FIG. 9 shows a diagram indicating the field variation of tangential shell and sagittal shell in the embodiment of FIG. 6.

It is evident that the imaging of the entrance pupil onto the first pupil surface P1 has a good correction status. This is also evident from FIG. 8 showing a diagram of the variation of the RMS spot size (in mm) as a function of the fractional object height FBY in the first pupil surface. The best focal plane is at −0.346 mm from the specified pupil position. This plane provides a preferred position for a correcting element, such as an aspheric plane parallel plate PP as discussed in connection with FIG. 1. The diagram of FIG. 9 shows that the field variation of tangential shell and sagittal shell is significantly improved (i.e. reduced) when compared to the reference system REF. The first pupil surface has only slight curvature, represented by a Petzval radius $R_P=-291$ mm.

Figure 10:
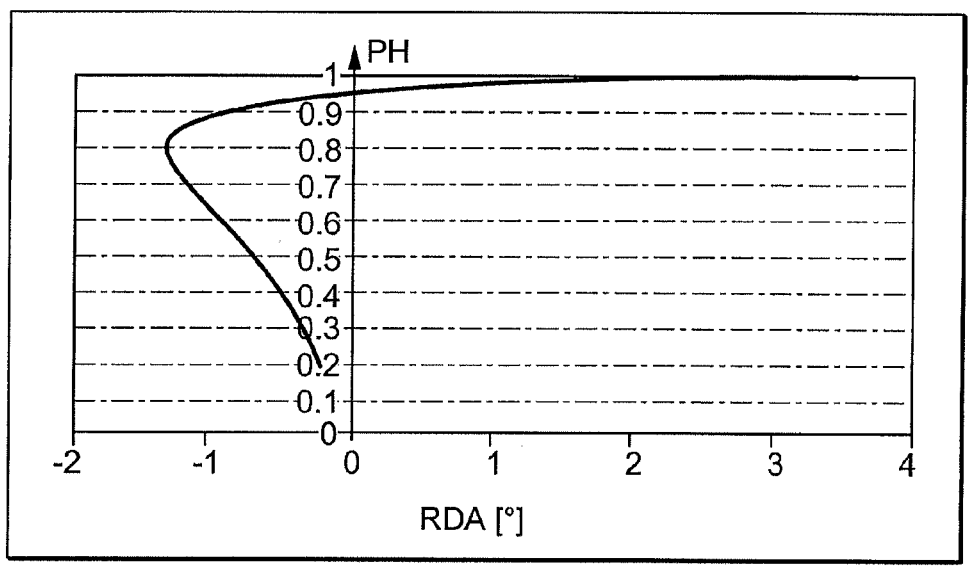
FIG. 10 shows a diagram of the dependency of the ray deflection angle RDA from the normalized pupil height PH for a zone lens L3-11 in FIG. 6.

In the embodiment of FIG. 6, the third objective part provides a significant contribution to correction of spherical aberration and coma of the object imaging (the imaging between the object surface OS and the image surface IS optically conjugated thereto). The third objective part includes, between the third pupil surface P3 and the image surface IS, in this order a biconvex positive lens L3-10 serving as a positive front lens, a zone lens L3-11 having negative refractive power in a peripheral zone apart the optical axis and positive refractive power in a center region including the optical axis, and a plano-convex lens L3-12 forming a rear positive lens group immediately upstream of the image surface. The zone lens L3-11 has a rotationally symmetric aspheric exit surface. In order to demonstrate the optical effect of zone lens L3-11 the diagram in FIG. 10 shows a ray deflection angle RDA (in degree) on the abscissa and the normalized pupil height PH on the ordinate. The ray deflection is demonstrated for a ray bundle originating from the optical axis. It is evident that the sense of deflection changes sign between the middle region around the optical axis (PH=0) and the edge of the pupil (PH=1) at about PH=0.95. This lens has a strong correcting effect on spherical aberration and coma of the object imaging.

Figure 11:
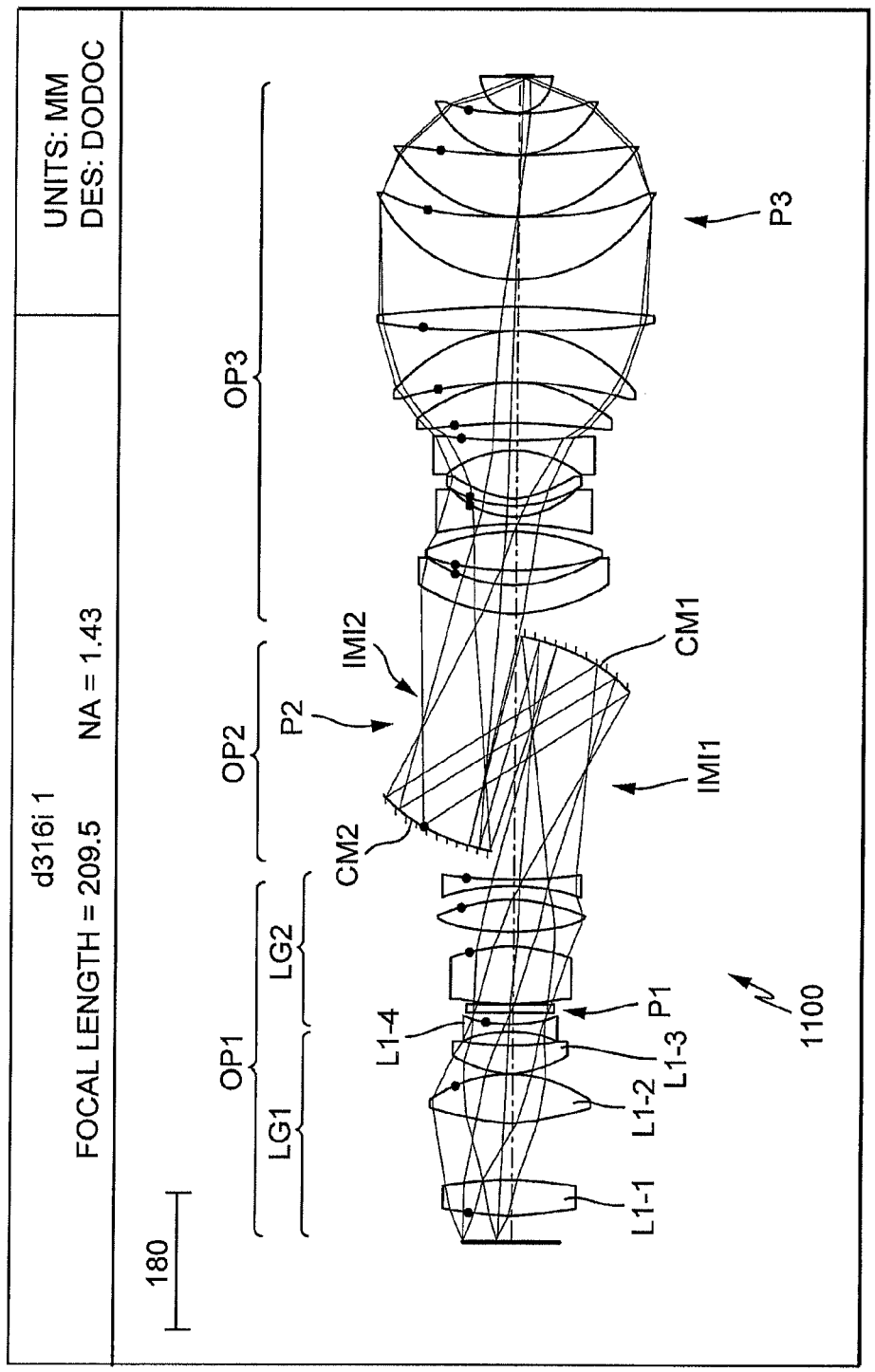
FIG. 11 shows a meridional section of another embodiment of a catadioptric projection objective.
Figure 12:
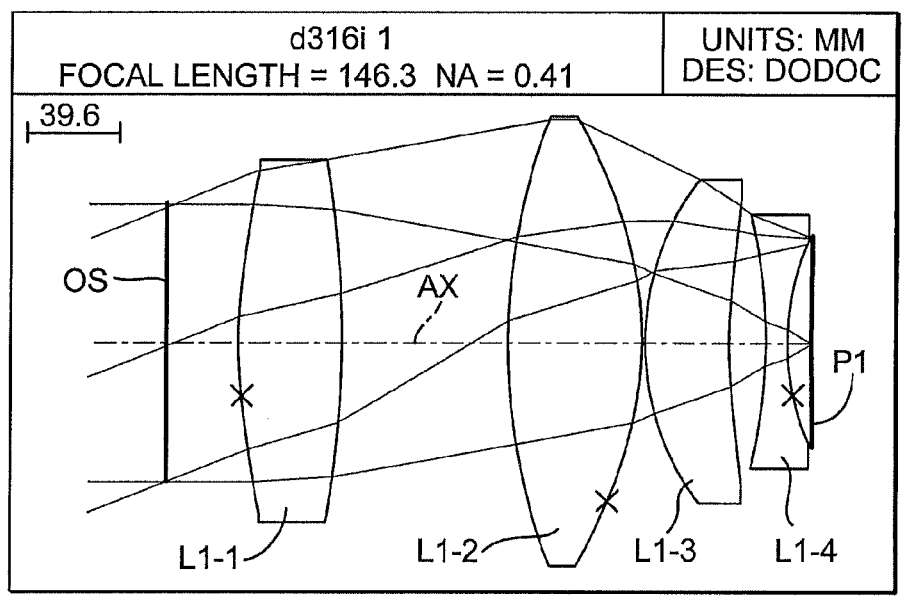
FIG. 12 shows an enlarged detail of the Fourier lens group LG1 of FIG. 11.

A further embodiment having the general layout as shown in FIG. 1 or 6 is shown in FIG. 11. The specifications are given in Table 11, 11A. The immersion-type projection objective 1100 is designed for operation wavelength $\lambda=193$ nm and has an image-side NA=1.43 in a rectangular field of size 26 mm×4 mm. All lenses are made from the same material, fused silica ($SiO_2$). The structure of the first lens group LG1 (Fourier lens group) is shown in detail in FIG. 12. The first group includes only four lenses, namely a biconvex positive lens L1-1, a biconvex positive lens L1-2, a positive meniscus lens L1-3 having an image-side concave surface, and a biconcave negative lens L1-4 forming the negative lens group immediately upstream of the first pupil surface P1. Aspheric surfaces, marked by "X" are used to support correction of field-dependent and aperture-dependent aberrations. The aspheric surface on the entry-side of first lens L1-1 immediately following the object surface contributes particularly to correction of the field-dependent aberrations, such as distortion. The aspheric surface on the exit-side of negative lens L1-4 immediately upstream of the pupil surface is predominantly effective to correct pupil aberrations essentially without influencing field-dependent aberrations. An intermediate asphere on the exit-side of biconvex lens L1-2 influences both field-dependent and aperture-dependent aberrations.

Figure 13:
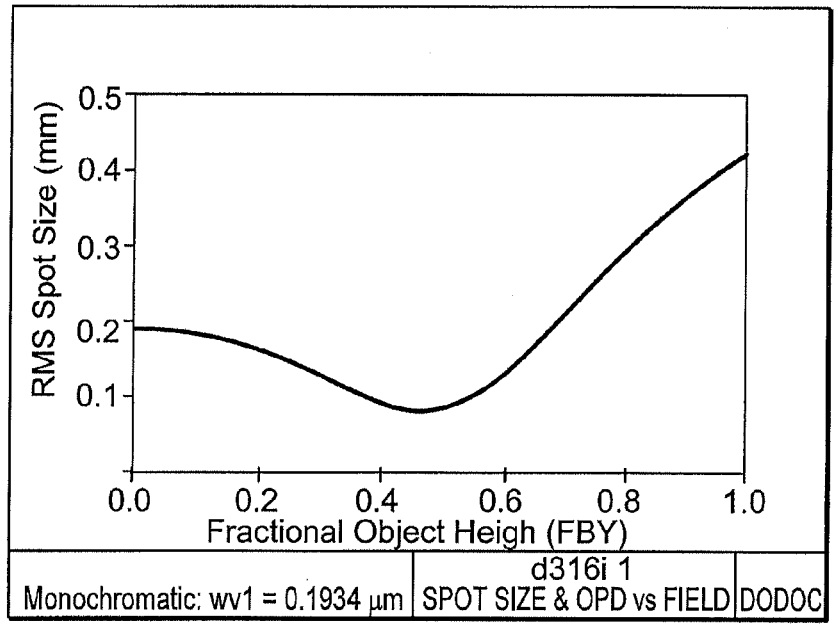
FIG. 13 shows a diagram representing the field variation of the RMS spot size of the projection objective in FIG. 11.
Figure 14:
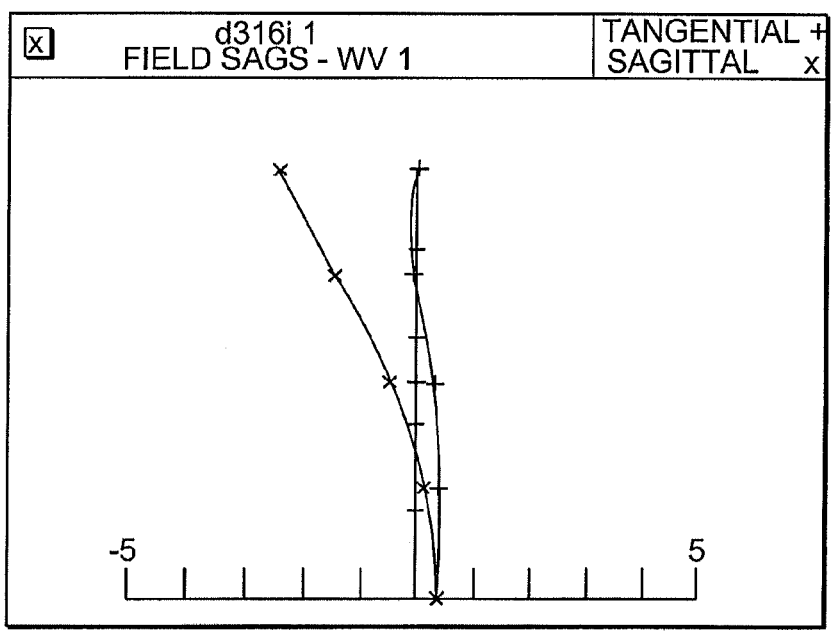
FIG. 14 shows a diagram indicating the field variation of tangential shell and sagittal shell in the embodiment of FIG. 11.

The correction status of first pupil surface P1 is represented by the diagrams in FIG. 13, showing the variation of the spot RMS across the field, and the tangential and sagittal shells are given in FIG. 14.

Figure 15:
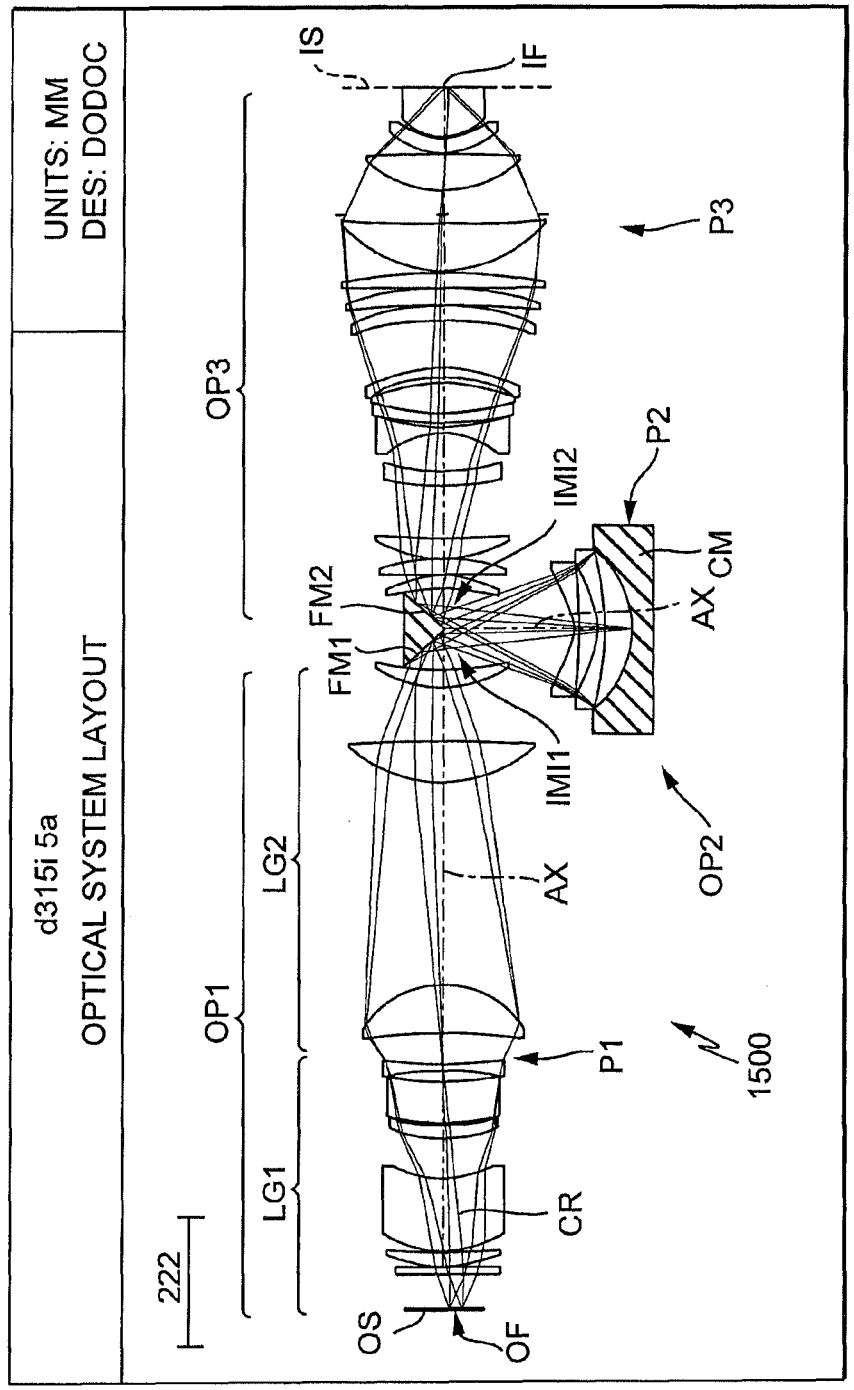
FIG. 15 shows a meridional section of another projection objective having a single concave mirror at a pupil surface.

A further embodiment of a catadioptric projection objective 1500 designed for $\lambda=193$ nm UV operating wavelength is shown in FIG. 15. An image-side numerical aperture NA=1.5 is obtained in a rectangular 26 mm×5 mm image field when used in immersion-operation with an immersion fluid between the exit surface of the projection objective and the image surface. The specification is given in Tables 15, 15A.

Folded projection objective 1500 is designed to project an image of a pattern on a reticle arranged in the planar object surface OS (object plane) into the planar image surface IS (image plane) on a reduced scale, for example, 4:1, while creating exactly two real intermediate images IMI1, IMI2. The rectangular effective object field OF and image field IF are off-axis, i.e. entirely outside the optical axis AX. A first refractive objective part OP1 is designed for imaging the pattern in the object surface into the first intermediate image IMI1. A second, catadioptric (refractive/reflective) objective part OP2 images the first intermediate image IMI1 into the second intermediate image IMI2 at a magnification close to 1:(−1). A third, refractive objective part OP3 images the second intermediate image IMI2 onto the image surface IS with a strong reduction ratio.

Three mutually conjugated pupil surfaces P1, P2 and P3 are formed at positions where the chief ray CR intersects the optical axis. A first pupil surface P1 is formed in the first objective part between object surface and first intermediate image, a second pupil surface P2 is formed in the second objective part between first and second intermediate image, and a third pupil surface P3 is formed in the third objective part between second intermediate image and the image surface IS.

The second objective part OP2 includes a single concave mirror CM. A first planar folding mirror FM1 is arranged optically close to the first intermediate image IMI1 at an angle of 45° to the optical axis AX such that it reflects the radiation coming from the object surface in the direction of the concave mirror CM. A second folding mirror FM2, having a planar mirror surface aligned at right angles to the planar mirror surface of the first folding mirror, reflects the radiation coming from the concave mirror CM in the direction of the image surface, which is parallel to the object surface.

The folding mirrors FM1, FM2 are each located in the optical vicinity of an intermediate image, so that the etendue (geometrical flux) is kept small. The intermediate images are optionally not located on the planar mirror surfaces, which results in a finite minimum distance between the intermediate image and the optically closest mirror surface. This is to ensure that any faults in the mirror surface, such as scratches or impurities, are not imaged sharply onto the image surface.

The first objective part OP1 includes two lens groups LG1, LG2 each with positive refractive power on either side of the first pupil surface P1. First lens group LG1 is designed to image the telecentric entrance pupil of the projection objective into the first pupil surface P1, thereby acting in the manner of a Fourier lens group performing a single Fourier transformation.

Figure 16:
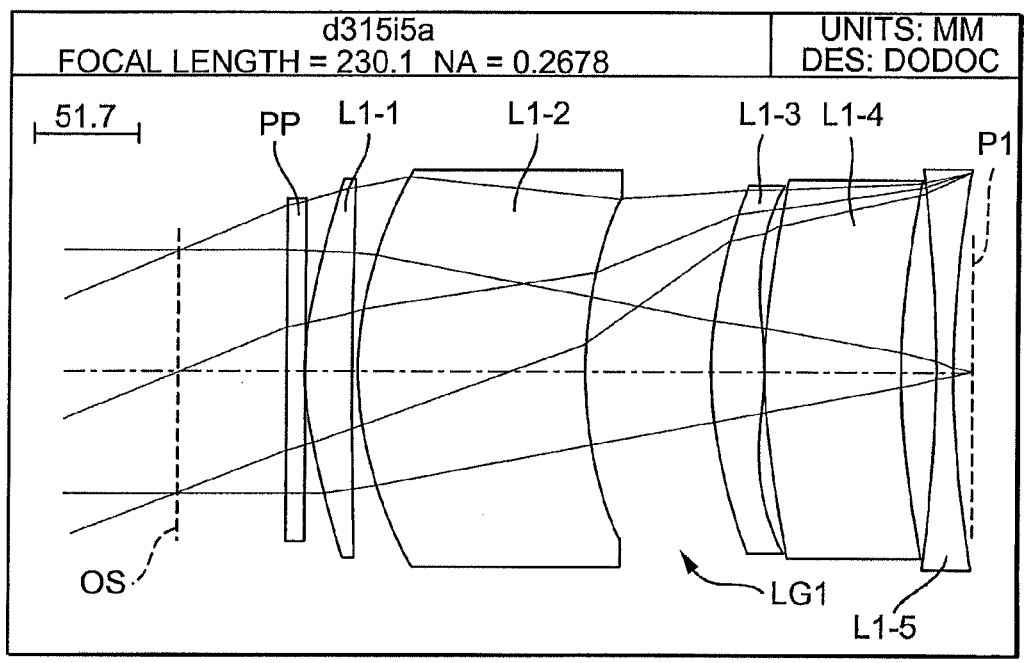
FIG. 16 shows an enlarged detail of the Fourier lens group of FIG. 15.

FIG. 16 shows an enlarged detail of the first lens group LG1 (Fourier lens group) imaging the object surface onto the first pupil surface P1. The first lens group includes a plane parallel plate PP adjacent to the object surface, a thin positive meniscus lens L1-1, a thick positive meniscus lens L1-2, a thin, strongly aspheric meniscus lens L1-3 having an aspheric image-side concave surface, a thick, positive meniscus lens L1-4 and a negative group formed by a single biconcave negative lens L1-5 immediately upstream of the first pupil surface P1 and optically close thereto. The positive meniscus lenses concave towards the pupil surface have strong positive power providing a strongly converging effect on the ray bundles, but there is only little contribution to image-field curvature due to the similar radii of the entrance and exit surfaces.

Figure 17:
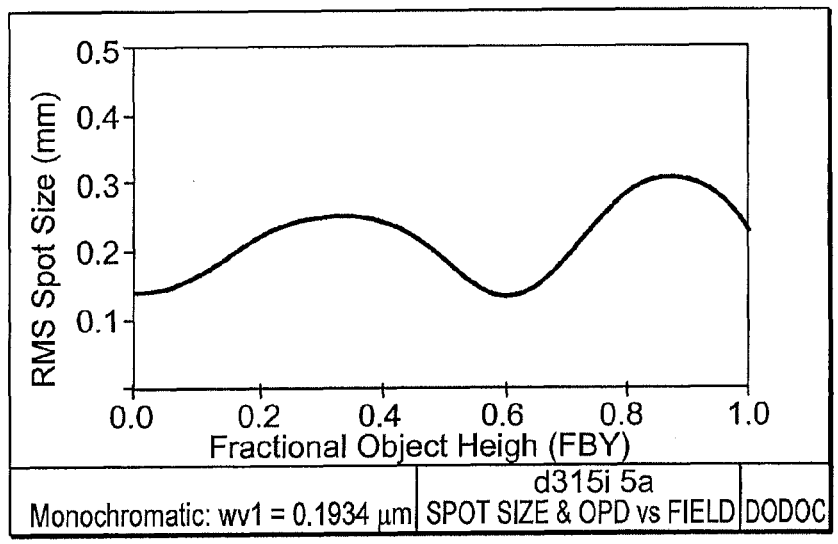
FIG. 17 shows a diagram representing the field variation of the RMS spot size of the projection objective in FIG. 15.
Figure 18:
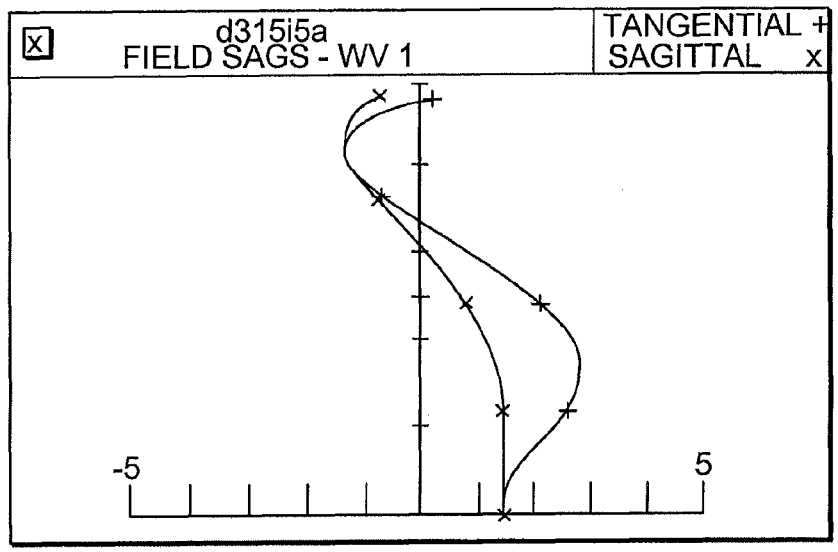
FIG. 18 shows a diagram indicating the field variation of tangential shell and sagittal shell in the embodiment of FIG. 15.

The correction status of first pupil surface P1 is represented by the diagrams in FIG. 17, showing the variation of the spot RMS across the field, and the tangential and sagittal shells are given in FIG. 18.

Figure 19:
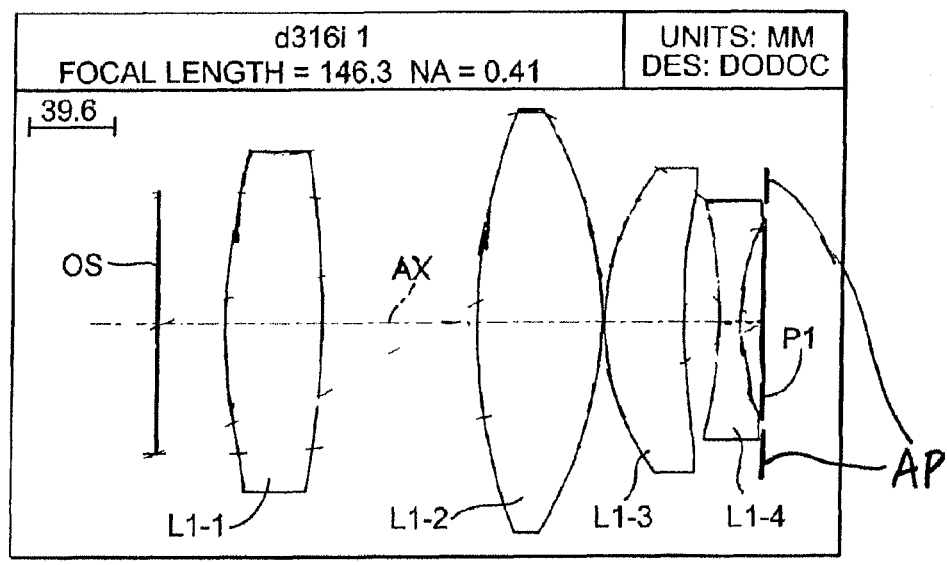
FIG. 19 shows a partial view of the catadioptric projection objective of FIG. 11 with an aperture stop positioned at a first pupil surface.
Figure 8:
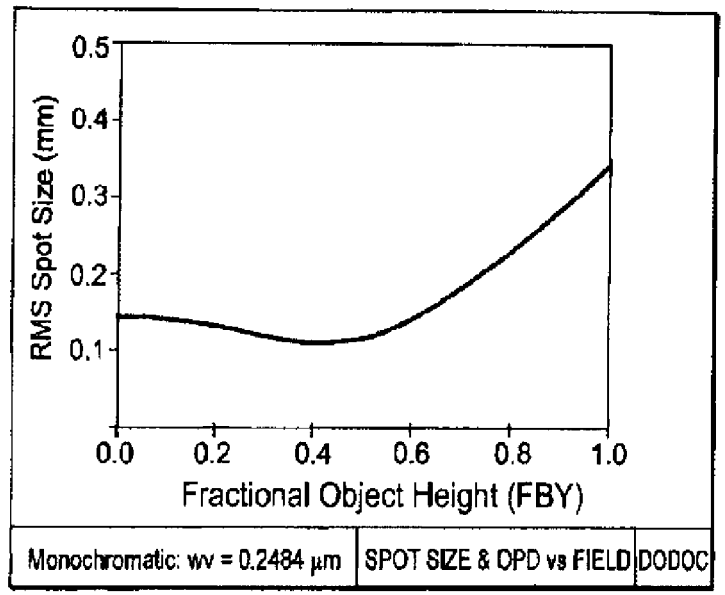
Figure 9:
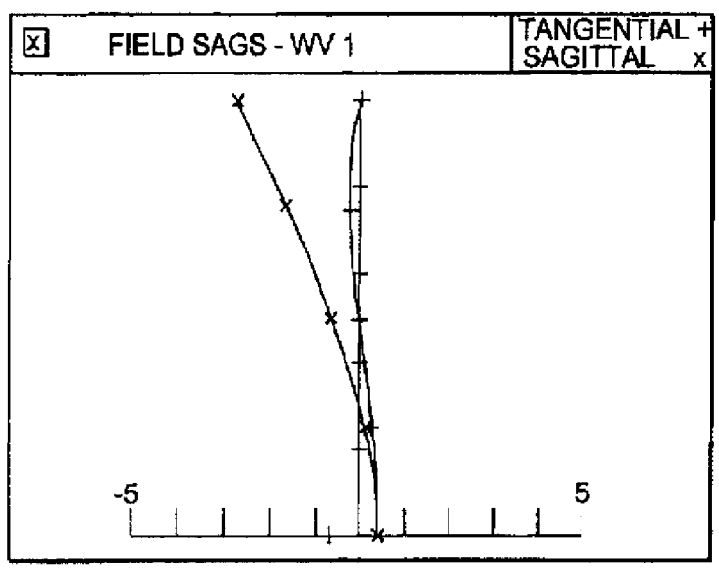
Figure 13:
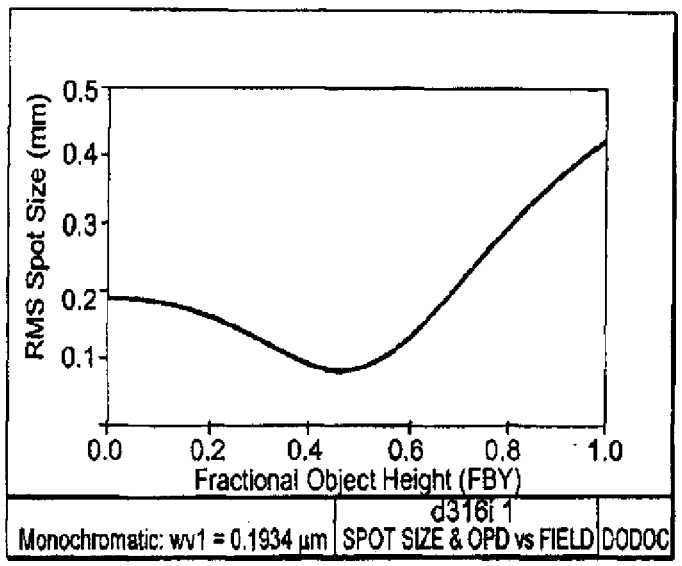
Figure 14:
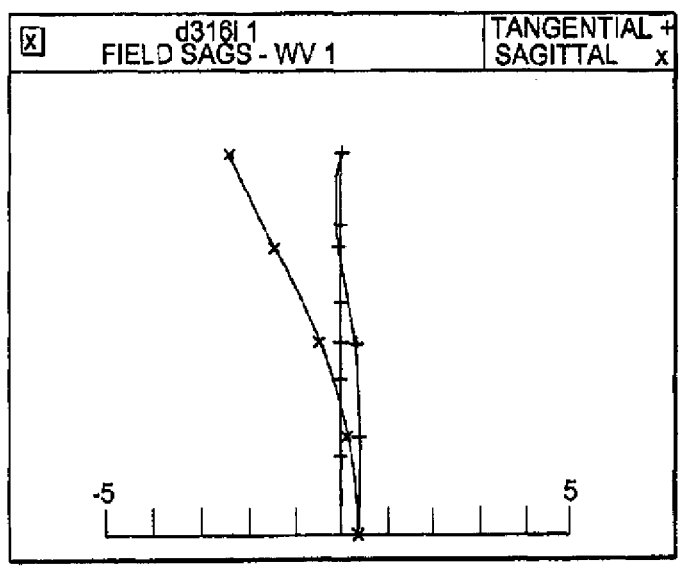
Figure 17:
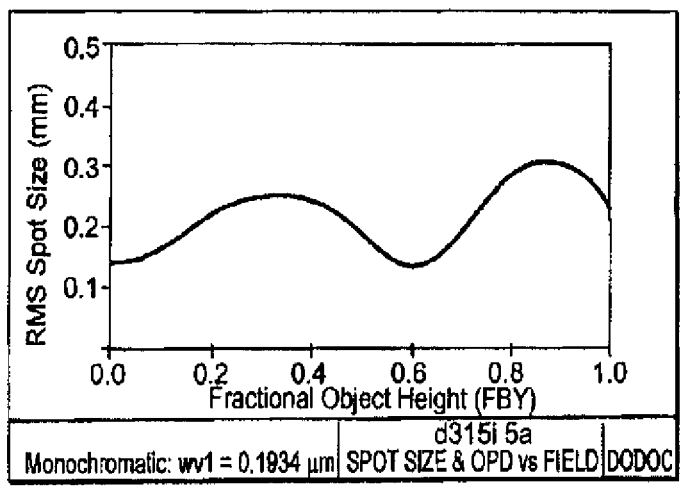
Figure 18:
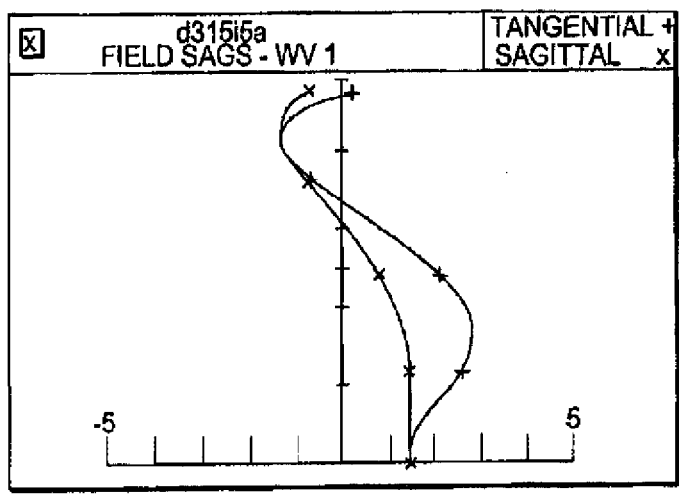

FIG. 19 shows a partial view of the catadioptric projection objective of FIG. 11 with an aperture stop AP positioned at a first pupil surface.

The above description of embodiments has been given by way of example. From the disclosure given, those skilled in the art will not only understand the present disclosure and its attendant advantages, but will also find apparent various changes and modifications to the structures and methods disclosed. It is sought, therefore, to cover all changes and modifications as fall within the spirit and scope of the disclosure, as defined by the appended claims, and equivalents thereof.

TABLE 1

NA = 1.55; field size 26 mm * 5.5 mm; λ = 193 nm

| Surface | Radius | | Thickness | Material | Index (193 nm) | ½ Diameter |
|---|---|---|---|---|---|---|
| 0 | 0.000000 | | 29.999023 | AIR | 1.00000000 | 63.700 |
| 1 | 0.000000 | | −0.293904 | AIR | 1.00000000 | 76.311 |
| 2 | 116.967388 | AS | 33.971623 | SIO2V | 1.56078570 | 93.710 |
| 3 | 268.858710 | | 45.405733 | AIR | 1.00000000 | 92.342 |
| 4 | −252.724978 | AS | 58.607153 | SIO2V | 1.56078570 | 92.157 |
| 5 | −152.905212 | | 0.986967 | AIR | 1.00000000 | 102.264 |
| 6 | 100.588881 | | 94.936165 | SIO2V | 1.56078570 | 89.748 |
| 7 | 480.541211 | AS | 22.683526 | AIR | 1.00000000 | 61.038 |
| 8 | −151.461922 | | 9.967307 | SIO2V | 1.56078570 | 58.676 |
| 9 | −1104.178549 | AS | 2.998283 | AIR | 1.00000000 | 54.598 |
| 10 | 0.000000 | | 0.000000 | AIR | 1.00000000 | 53.972 |
| 11 | 0.000000 | | 26.000000 | AIR | 1.00000000 | 53.972 |
| 12 | −4615.634680 | | 9.983258 | SIO2V | 1.56078570 | 77.043 |
| 13 | −7648.187834 | | 9.234701 | AIR | 1.00000000 | 82.010 |
| 14 | −625.750713 | | 48.866298 | SIO2V | 1.56078570 | 85.509 |
| 15 | −110.073136 | AS | 47.938753 | AIR | 1.00000000 | 90.434 |
| 16 | 693.459276 | | 15.566986 | SIO2V | 1.56078570 | 114.997 |
| 17 | 2225.036283 | | 111.995402 | AIR | 1.00000000 | 115.765 |
| 18 | −209.012550 | | 24.611839 | SIO2V | 1.56078570 | 126.681 |
| 19 | −181.333947 | AS | 37.469604 | AIR | 1.00000000 | 129.924 |
| 20 | 0.000000 | | 238.315935 | AIR | 1.00000000 | 129.948 |
| 21 | −214.798316 | AS | — | REFL | 1.00000000 | 151.231 |
| 22 | 186.831531 | AS | 238.315935 | REFL | 1.00000000 | 153.712 |
| 23 | 0.000000 | | 37.462671 | AIR | 1.00000000 | 111.274 |
| 24 | 297.174670 | | 29.574318 | SIO2V | 1.56078570 | 123.808 |
| 25 | 1191.420870 | | 35.484494 | AIR | 1.00000000 | 123.384 |
| 26 | 4081.914442 | | 22.323161 | SIO2V | 1.56078570 | 122.901 |
| 27 | 273.503277 | AS | 0.998916 | AIR | 1.00000000 | 122.715 |
| 28 | 231.074591 | AS | 9.994721 | SIO2V | 1.56078570 | 108.656 |
| 29 | 162.434674 | | 7.329878 | AIR | 1.00000000 | 100.728 |
| 30 | 173.924185 | | 9.996236 | SIO2V | 1.56078570 | 100.278 |
| 31 | 147.324038 | | 39.865421 | AIR | 1.00000000 | 96.038 |
| 32 | 517.833939 | AS | 9.994259 | SIO2V | 1.56078570 | 95.918 |
| 33 | 418.975568 | | 18.691694 | AIR | 1.00000000 | 97.853 |
| 34 | 402.609022 | | 9.991838 | SIO2V | 1.56078570 | 103.816 |
| 35 | 225.169608 | AS | 18.474719 | AIR | 1.00000000 | 105.756 |
| 36 | 350.705440 | AS | 25.452147 | SIO2V | 1.56078570 | 107.818 |
| 37 | −3388.791523 | | 12.488356 | AIR | 1.00000000 | 110.250 |
| 38 | 1008.270218 | AS | 41.022442 | SIO2V | 1.56078570 | 119.521 |
| 39 | −314.632041 | | 3.943706 | AIR | 1.00000000 | 121.832 |
| 40 | 1442.963243 | AS | 12.476333 | SIO2V | 1.56078570 | 126.022 |
| 41 | −1002.829857 | | 14.096377 | AIR | 1.00000000 | 126.891 |
| 42 | 194.591039 | | 81.128704 | SIO2V | 1.56078570 | 132.890 |
| 43 | −264.895277 | AS | −22.880987 | AIR | 1.00000000 | 131.108 |
| 44 | 0.000000 | | −0.362185 | AIR | 1.00000000 | 132.343 |
| 45 | 0.000000 | | 24.001275 | AIR | 1.00000000 | 132.533 |
| 46 | 159.644367 | | 50.327970 | SIO2V | 1.56078570 | 109.736 |
| 47 | 494.742901 | AS | 0.961215 | AIR | 1.00000000 | 105.155 |
| 48 | 328.066727 | | 14.868291 | SIO2V | 1.56078570 | 92.427 |
| 49 | −3072.231603 | AS | 0.927658 | AIR | 1.00000000 | 86.384 |
| 50 | 84.317525 | | 69.022697 | LuAG | 2.15000000 | 64.842 |
| 51 | 0.000000 | | 3.100000 | HINDLIQ | 1.65002317 | 24.540 |
| 52 | 0.000000 | | 0.000000 | | | 15.928 |

TABLE 1A

Aspheric constants

| SRF | 2 | 4 | 7 | 9 | 15 |
|---|---|---|---|---|---|
| K | 0 | 0 | 0 | 0 | 0 |
| C1 | −4.353148e−08 | −9.800573e−08 | 2.666231e−07 | 1.295769e−07 | 1.774606e−08 |
| C2 | −1.948518e−13 | 5.499401e−13 | −1.471516e−11 | 1.032347e−11 | 1.042043e−13 |
| C3 | −3.477204e−16 | −1.499103e−16 | −1.385474e−15 | 5.718200e−15 | 2.794961e−17 |
| C4 | 2.346643e−20 | −1.967686e−20 | 2.138176e−18 | −4.988183e−18 | −3.892158e−21 |
| C5 | −2.078112e−24 | 4.517642e−24 | −1.482225e−22 | 1.949505e−21 | 4.464755e−25 |
| C6 | −8.347999e−31 | −2.738209e−28 | −8.304062e−27 | −2.335999e−25 | 4.773462e−30 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

TABLE 1A-continued

Aspheric constants

| SRF | 19 | 21 | 22 | 27 | 28 |
|---|---|---|---|---|---|
| K | 0 | −2.01691 | −1.35588 | 0 | 0 |
| C1 | −1.294881e−08 | −1.791441e−08 | 1.799581e−08 | −2.305522e−07 | −5.364751e−08 |
| C2 | 2.960445e−14 | 1.393731e−13 | 6.604119e−14 | −2.977863e−12 | 2.985313e−12 |
| C3 | −3.744673e−18 | −1.959652e−18 | 1.091967e−16 | 1.067601e−15 | 1.185542e−16 |
| C4 | 3.872183e−22 | 3.972150e−23 | 3.177716e−23 | −7.036742e−20 | −5.029250e−20 |
| C5 | −1.724706e−26 | −6.577183e−28 | −5.281159e−28 | 2.314154e−24 | 3.896020e−24 |
| C6 | 4.346424e−31 | 6.141114e−33 | 1.575655e−32 | −3.151486e−29 | −1.479810e−28 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| SRF | 32 | 35 | 36 | 38 | 40 |
|---|---|---|---|---|---|
| K | 0 | 0 | 0 | 0 | 0 |
| C1 | 2.753990e−08 | 1.438723e−07 | 4.030346e−08 | 4.491651e−08 | −9.637167e−08 |
| C2 | −2.426854e−11 | −2.226044e−11 | −6.610222e−12 | −5.791619e−12 | 3.256893e−12 |
| C3 | 1.360579e−15 | 1.482620e−15 | 2.501723e−16 | 5.024169e−16 | −9.241857e−17 |
| C4 | −1.150640e−19 | −5.040252e−20 | −2.574681e−21 | −3.768862e−20 | 9.112235e−21 |
| C5 | 7.525459e−24 | 1.831772e−24 | −7.619628e−25 | 1.711080e−24 | 9.519978e−26 |
| C6 | −2.203312e−30 | −8.726413e−29 | 1.815817e−29 | −3.990765e−29 | −1.423818e−29 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| SRF | 43 | 47 | 49 |
|---|---|---|---|
| K | 0 | 0 | 0 |
| C1 | 5.213696e−08 | −1.687244e−07 | 1.276858e−07 |
| C2 | −2.852489e−13 | 1.277072e−11 | 1.143276e−12 |
| C3 | 6.349974e−17 | −5.376139e−16 | −2.525252e−16 |
| C4 | −4.223029e−21 | 1.564911e−20 | 9.197266e−20 |
| C5 | 1.155960e−25 | −3.759137e−25 | −8.401499e−24 |
| C6 | −1.415349e−30 | 1.266337e−29 | 6.171793e−28 |
| C7 | 0.000000e+00 | 0.000000e+00 | 0.000000e+00 |
| C8 | 0.000000e+00 | 0.000000e+00 | 0.000000e+00 |
| C9 | 0.000000e+00 | 0.000000e+00 | 0.000000e+00 |

TABLE 2

(REF)
NA = 1.55; field size 26 mm * 5.5 mm; λ = 193 nm

| Surface | Radius | | Thickness | Material | Index (193 nm) | ½ Diameter |
|---|---|---|---|---|---|---|
| 0 | 0.000000 | | 29.999023 | AIR | 1.00000000 | 63.700 |
| 1 | 0.000000 | | −0.017795 | AIR | 1.00000000 | 76.344 |
| 2 | 171.343027 | AS | 42.631678 | SIO2V | 1.56078570 | 85.956 |
| 3 | −4741.853546 | | 61.874338 | AIR | 1.00000000 | 86.356 |
| 4 | 105.977997 | | 65.572103 | SIO2V | 1.56078570 | 88.863 |
| 5 | −861.150434 | AS | 6.951388 | AIR | 1.00000000 | 82.403 |
| 6 | 258.046433 | | 33.648405 | SIO2V | 1.56078570 | 67.159 |
| 7 | 1920.848867 | AS | 8.790277 | AIR | 1.00000000 | 50.974 |
| 8 | 0.000000 | | 0.000000 | AIR | 1.00000000 | 47.230 |
| 9 | 0.000000 | | 26.000000 | AIR | 1.00000000 | 47.230 |
| 10 | 0.000000 | | 10.337048 | SIO2V | 1.56078570 | 61.729 |
| 11 | 0.000000 | | 48.824997 | AIR | 1.00000000 | 65.126 |
| 12 | −409.968959 | | 9.999996 | SIO2V | 1.56078570 | 87.149 |
| 13 | −1728.574510 | AS | 0.999396 | AIR | 1.00000000 | 92.240 |
| 14 | −1262.850901 | | 37.699713 | SIO2V | 1.56078570 | 94.725 |
| 15 | −164.338442 | | 35.734593 | AIR | 1.00000000 | 97.786 |
| 16 | −892.837978 | | 27.787355 | SIO2V | 1.56078570 | 106.595 |
| 17 | −216.768119 | AS | 37.495802 | AIR | 1.00000000 | 107.808 |
| 18 | 0.000000 | | 231.516797 | AIR | 1.00000000 | 107.221 |
| 19 | −184.700839 | AS | −231.516797 | REFL | 1.00000000 | 157.546 |
| 20 | 202.731693 | AS | 231.516797 | REFL | 1.00000000 | 156.228 |
| 21 | 0.000000 | | 37.496341 | AIR | 1.00000000 | 114.709 |
| 22 | 162.462380 | | 39.081598 | SIO2V | 1.56078570 | 112.418 |
| 23 | 264.446518 | AS | 63.339427 | AIR | 1.00000000 | 109.444 |
| 24 | −571.769195 | AS | 9.999663 | SIO2V | 1.56078570 | 91.313 |
| 25 | 708.749519 | | 17.121515 | AIR | 1.00000000 | 87.569 |
| 26 | −507.008359 | | 9.999717 | SIO2V | 1.56078570 | 86.854 |
| 27 | 140.591845 | | 19.187442 | AIR | 1.00000000 | 84.837 |
| 28 | 184.194102 | AS | 15.968244 | SIO2V | 1.56078570 | 86.582 |

TABLE 2-continued (REF)
NA = 1.55; field size 26 mm * 5.5 mm; λ = 193 nm

| Surface | Radius | | Thickness | Material | Index (193 nm) | ½ Diameter |
|---|---|---|---|---|---|---|
| 29 | 283.845514 | | 31.748225 | AIR | 1.00000000 | 90.637 |
| 30 | 4904.309359 | | 10.047458 | SIO2V | 1.56078570 | 103.627 |
| 31 | 274.252599 | AS | 13.944029 | AIR | 1.00000000 | 113.490 |
| 32 | 309.375419 | AS | 28.215577 | SIO2V | 1.56078570 | 120.624 |
| 33 | −920.430769 | | 1.767414 | AIR | 1.00000000 | 124.772 |
| 34 | 18975.064444 | AS | 70.355114 | SIO2V | 1.56078570 | 127.703 |
| 35 | −162.879880 | | 12.292563 | AIR | 1.00000000 | 132.134 |
| 36 | −2025.460472 | AS | 9.999587 | SIO2V | 1.56078570 | 141.670 |
| 37 | −722.326749 | | 0.998787 | AIR | 1.00000000 | 143.067 |
| 38 | 276.303253 | | 73.567109 | SIO2V | 1.56078570 | 150.848 |
| 39 | −523.286381 | AS | −10.418710 | AIR | 1.00000000 | 149.454 |
| 40 | 0.000000 | | −0.362185 | AIR | 1.00000000 | 145.848 |
| 41 | 0.000000 | | 11.777558 | AIR | 1.00000000 | 145.992 |
| 42 | 203.342152 | | 65.192017 | SIO2V | 1.56078570 | 131.067 |
| 43 | −779.130399 | AS | 0.997958 | AIR | 1.00000000 | 126.720 |
| 44 | 305.958782 | | 21.191217 | SIO2V | 1.56078570 | 103.169 |
| 45 | −48623.319668 | AS | 0.987133 | AIR | 1.00000000 | 97.187 |
| 46 | 95.078716 | | 76.560136 | LuAG | 2.15000000 | 71.117 |
| 47 | 0.000000 | | 3.100000 | HINDLIQ | 1.65002317 | 24.554 |
| 48 | 0.000000 | | 0.000000 | | | 15.926 |

TABLE 2A

Aspheric constants

| SRF | 2 | 5 | 7 | 13 | 17 |
|---|---|---|---|---|---|
| K | 0 | 0 | 0 | 0 | 0 |
| C1 | 5.535754e−09 | −2.163453e−08 | 2.131940e−07 | −6.511619e−08 | 1.346551e−08 |
| C2 | −2.217501e−12 | 3.505228e−13 | 2.096996e−11 | 2.291139e−13 | 7.406450e−13 |
| C3 | 1.496293e−16 | 3.144204e−15 | 2.247871e−15 | −8.522321e−17 | 2.478135e−17 |
| C4 | −8.752146e−21 | −5.148203e−19 | 2.662065e−18 | 3.174503e−21 | 4.410963e−22 |
| C5 | 2.789483e−25 | 3.453724e−23 | −1.491642e−21 | −1.364637e−25 | 1.313895e−26 |
| C6 | −2.329972e−30 | −9.033416e−28 | 6.227531e−25 | 4.124720e−30 | −8.547823e−31 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| SRF | 19 | 20 | 23 | 24 | 28 |
|---|---|---|---|---|---|
| K | −1.52592 | −1.42277 | 0 | 0 | 0 |
| C1 | −1.765080e−08 | 1.613577e−08 | −4.798352e−08 | 4.255285e−08 | −1.477745e−07 |
| C2 | 4.917900e−14 | 4.357122e−14 | −1.311955e−12 | −1.146206e−11 | 1.210948e−12 |
| C3 | −9.914290e−19 | 9.093916e−19 | 3.514210e−18 | 6.521380e−16 | −5.978764e−16 |
| C4 | 5.089307e−24 | 8.683689e−24 | 1.024784e−21 | −6.959952e−20 | 5.086484e−20 |
| C5 | −1.439617e−28 | −2.826288e−29 | 1.466905e−25 | 8.075085e−24 | −2.048151e−24 |
| C6 | −2.489761e−34 | 3.718326e−33 | −6.750818e−30 | −3.306910e−28 | 1.559775e−28 |
| C7 | 0.000000e+00 | | | | |
| C8 | 0.000000e+00 | | | | |
| C9 | 0.000000e+00 | | | | |

| SRF | 31 | 32 | 34 | 36 | 39 |
|---|---|---|---|---|---|
| K | 0 | 0 | 0 | 0 | 0 |
| C1 | −5.803167e−08 | −8.321353e−08 | −3.416619e−08 | −3.711339e−08 | 4.221371e−09 |
| C2 | 5.110289e−12 | 3.106108e−12 | 1.834441e−12 | 3.509157e−13 | −1.476275e−13 |
| C3 | −7.215213e−16 | −1.869923e−16 | −1.168356e−16 | 1.204985e−17 | 3.254133e−18 |
| C4 | 4.298822e−20 | 7.706750e−21 | −1.174247e−22 | 6.896527e−22 | 9.967170e−22 |
| C5 | −1.225430e−24 | −4.141276e−25 | 4.114824e−26 | 3.435906e−26 | −5.090064e−26 |
| C6 | 7.229558e−30 | 1.166645e−29 | −1.539536e−29 | −2.039666e−30 | 6.695129e−31 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| SRF | 43 | 45 |
|---|---|---|
| K | 0 | 0 |
| C1 | 6.584837e−09 | 4.103097e−08 |
| C2 | 1.476709e−12 | 1.320693e−12 |
| C3 | −2.128509e−16 | 2.055670e−16 |
| C4 | 1.488828e−20 | −1.513267e−20 |
| C5 | −5.015220e−25 | 8.328043e−25 |

TABLE 2A-continued

| Aspheric constants | | |
|---|---|---|
| C6 | 7.209855e−30 | −7.654058e−30 |
| C7 | 0.000000e+00 | 0.000000e+00 |
| C8 | 0.000000e+00 | 0.000000e+00 |
| C9 | 0.000000e+00 | 0.000000e+00 |

TABLE 6

NA = 1.47; field size 26 mm * 5.5 mm; λ = 248 nm

| Surface | Radius | | Thickness | Material | Index (248 nm) | ½ Diameter |
|---|---|---|---|---|---|---|
| 0 | 0.000000 | | 29.999023 | AIR | 1.00000000 | 63.700 |
| 1 | 0.000000 | | −0.016587 | AIR | 1.00000000 | 75.565 |
| 2 | 128.928301 | AS | 42.026693 | SIO2V | 1.50885281 | 87.914 |
| 3 | −2130.241282 | | 44.327573 | AIR | 1.00000000 | 87.576 |
| 4 | −117.301124 | AS | 37.980898 | SIO2V | 1.50885281 | 87.249 |
| 5 | −121.095557 | | 0.999318 | AIR | 1.00000000 | 97.646 |
| 6 | 124.335144 | | 49.904800 | SIO2V | 1.50885281 | 88.572 |
| 7 | −1015.089235 | | 0.999887 | AIR | 1.00000000 | 85.114 |
| 8 | 841.474542 | | 19.999813 | SIO2V | 1.50885281 | 79.220 |
| 9 | −265.863207 | AS | 24.244189 | AIR | 1.00000000 | 74.122 |
| 10 | −130.163272 | | 19.998818 | SIO2V | 1.50885281 | 61.644 |
| 11 | 245.744624 | AS | 8.799263 | AIR | 1.00000000 | 54.069 |
| 12 | 0.000000 | | 0.000000 | AIR | 1.00000000 | 53.816 |
| 13 | 0.000000 | | 0.998863 | AIR | 1.00000000 | 53.816 |
| 14 | 262.324322 | | 24.657808 | SIO2V | 1.50885281 | 60.964 |
| 15 | −241.892483 | | 1.204928 | AIR | 1.00000000 | 64.095 |
| 16 | −388.893369 | | 20.002393 | SIO2V | 1.50885281 | 65.782 |
| 17 | −134.956755 | AS | 95.737496 | AIR | 1.00000000 | 68.599 |
| 18 | 270.042558 | | 21.031793 | SIO2V | 1.50885281 | 102.358 |
| 19 | 651.399601 | | 64.989823 | AIR | 1.00000000 | 102.511 |
| 20 | −126.975206 | | 19.999827 | SIO2V | 1.50885281 | 102.966 |
| 21 | −145.489260 | AS | 37.494736 | AIR | 1.00000000 | 110.060 |
| 22 | 0.000000 | | 275.711491 | AIR | 1.00000000 | 116.538 |
| 23 | −253.239170 | AS | — | REFL | 1.00000000 | 195.865 |
| 24 | 186.748589 | AS | 275.711491 | REFL | 1.00000000 | 140.517 |
| 25 | 0.000000 | | 37.497070 | AIR | 1.00000000 | 114.897 |
| 26 | −4183.753618 | | 43.458815 | SIO2V | 1.50885281 | 118.592 |
| 27 | −202.559737 | AS | 13.648419 | AIR | 1.00000000 | 119.292 |
| 28 | −175.419986 | AS | 19.999522 | SIO2V | 1.50885281 | 116.494 |
| 29 | −154.929816 | | 0.999549 | AIR | 1.00000000 | 118.150 |
| 30 | −229.271599 | | 19.999486 | SIO2V | 1.50885281 | 105.369 |
| 31 | 122.750670 | AS | 49.793521 | AIR | 1.00000000 | 100.243 |
| 32 | 190.556325 | AS | 46.859904 | SIO2V | 1.50885281 | 121.109 |
| 33 | −943.347591 | | 7.041362 | AIR | 1.00000000 | 121.790 |
| 34 | −845.190598 | | 19.999826 | SIO2V | 1.50885281 | 122.081 |
| 35 | 147.937513 | AS | 29.168833 | AIR | 1.00000000 | 128.004 |
| 36 | 1388.526462 | AS | 45.306600 | SIO2V | 1.50885281 | 131.120 |
| 37 | −523.436578 | | 4.347825 | AIR | 1.00000000 | 133.458 |
| 38 | 5449.999826 | AS | 19.999851 | SIO2V | 1.50885281 | 134.608 |
| 39 | −348.816325 | | 0.999597 | AIR | 1.00000000 | 137.891 |
| 40 | 340.272237 | AS | 67.587519 | SIO2V | 1.50885281 | 153.819 |
| 41 | −323.687667 | | 58.231540 | AIR | 1.00000000 | 155.356 |
| 42 | 0.000000 | | 0.000000 | AIR | 1.00000000 | 154.131 |
| 43 | 0.000000 | | −57.242893 | AIR | 1.00000000 | 154.131 |
| 44 | 225.119659 | | 90.762438 | SIO2V | 1.50885281 | 154.660 |
| 45 | −354.115170 | AS | 0.997569 | AIR | 1.00000000 | 152.747 |
| 46 | 332.230008 | | 48.061330 | SIO2V | 1.50885281 | 131.162 |
| 47 | −1361.523117 | AS | 1.268990 | AIR | 1.00000000 | 127.295 |
| 48 | −810.795253 | | 19.998161 | SIO2V | 1.50885281 | 122.580 |
| 49 | −451.036733 | AS | 0.994751 | AIR | 1.00000000 | 113.480 |
| 50 | 93.456855 | | 76.027617 | LUAG | 2.02093434 | 71.508 |
| 51 | 0.000000 | | 3.100000 | HIL001 | 1.54048002 | 26.023 |
| 52 | 0.000000 | | 0.000000 | | | 15.926 |

TABLE 6A

Aspheric constants

| SRF | 2 | 4 | 9 | 11 | 17 |
|---|---|---|---|---|---|
| K | 0 | 0 | 0 | 0 | 0 |
| C1 | −4.384112e−08 | −4.412855e−08 | 2.029683e−07 | 3.217532e−08 | 6.242700e−08 |
| C2 | 6.119422e−13 | −1.990073e−12 | 7.567548e−13 | 2.824684e−12 | 2.636674e−12 |
| C3 | −2.550937e−17 | 8.072280e−16 | −8.040857e−16 | −3.870631e−15 | 7.268545e−16 |
| C4 | −2.008613e−19 | −1.589989e−19 | −2.373612e−20 | −2.969833e−19 | −1.576215e−19 |
| C5 | 6.058069e−23 | 3.137776e−23 | 1.268368e−23 | 6.242046e−22 | 1.095770e−22 |
| C6 | −9.717788e−27 | −5.193051e−27 | −3.735037e−27 | −7.218140e−26 | −3.106810e−26 |
| C7 | 8.441816e−31 | 3.741282e−31 | 2.516910e−31 | −5.174396e−29 | 4.585559e−30 |
| C8 | −3.120207e−35 | −1.034688e−35 | −8.393442e−36 | 1.110006e−32 | −3.071967e−34 |
| C9 | 0.000000e+00 | 0.000000e+00 | 0.000000e+00 | 0.000000e+00 | 0.000000e+00 |

| SRF | 21 | 23 | 24 | 27 | 28 |
|---|---|---|---|---|---|
| K | 0 | −3.141 | −1.33118 | 0 | 0 |
| C1 | −2.862443e−08 | −2.174149e−08 | 1.549149e−08 | 8.131862e−08 | 7.955643e−08 |
| C2 | −8.771349e−13 | 2.517297e−13 | 3.397419e−14 | −1.707739e−12 | 2.867120e−12 |
| C3 | −1.596517e−17 | −5.825790e−18 | 1.032630e−19 | −3.301596e−17 | −1.099153e−15 |
| C4 | −4.646004e−21 | 1.362810e−22 | 1.136332e−22 | −5.761262e−20 | 3.424317e−20 |
| C5 | 8.126190e−25 | −3.290251e−27 | −8.250734e−27 | 4.724568e−24 | 3.332299e−25 |
| C6 | −1.135755e−28 | 6.790431e−32 | 3.149468e−31 | −1.202012e−28 | −4.827974e−29 |
| C7 | 7.299024e−33 | −9.159117e−37 | −5.928263e−36 | 4.082908e−33 | 2.861844e−33 |
| C8 | −2.111452e−37 | 6.183391e−42 | 4.153068e−41 | 1.760434e−38 | −6.298301e−38 |
| C9 | 0.000000e+00 | 0.000000e+00 | 0.000000e+00 | 0.000000e+00 | 0.000000e+00 |

| SRF | 31 | 32 | 35 | 36 | 38 |
|---|---|---|---|---|---|
| K | 0 | 0 | 0 | 0 | 0 |
| C1 | −8.939854e−08 | −1.036340e−07 | −9.696640e−08 | 8.511140e−08 | −6.457556e−08 |
| C2 | 4.348686e−12 | 1.316189e−12 | 1.108503e−13 | −2.457731e−12 | 8.723554e−13 |
| C3 | −8.114178e−16 | 6.095759e−17 | −1.060162e−16 | 3.903750e−17 | −3.888178e−17 |
| C4 | 6.060580e−20 | 2.984406e−21 | 8.228345e−21 | −6.588883e−21 | 6.708466e−22 |
| C5 | −3.926918e−24 | 5.719431e−26 | −4.559678e−25 | 5.019357e−25 | −3.249478e−26 |
| C6 | 7.618517e−29 | 2.198926e−29 | 1.569417e−29 | −1.721031e−29 | 3.981782e−30 |
| C7 | 8.937963e−33 | −2.899121e−33 | −4.855487e−34 | 2.943619e−34 | −1.652000e−34 |
| C8 | −7.773344e−37 | 7.179029e−38 | 4.866053e−39 | −4.420955e−39 | 1.394293e−39 |
| C9 | 0.000000e+00 | 0.000000e+00 | 0.000000e+00 | 0.000000e+00 | 0.000000e+00 |

| SRF | 40 | 45 | 47 | 49 |
|---|---|---|---|---|
| K | 0 | 0 | 0 | 0 |
| C1 | −3.047152e−08 | 2.876681e−08 | −7.237631e−08 | 3.127564e−08 |
| C2 | −2.503917e−13 | −4.981655e−13 | 7.328144e−12 | −1.483849e−12 |
| C3 | −2.036991e−17 | 2.984706e−17 | −5.046596e−16 | 2.815259e−17 |
| C4 | 2.564810e−21 | −7.422489e−22 | 1.891226e−20 | 2.747470e−20 |
| C5 | −1.078825e−25 | 1.333563e−26 | −2.625122e−25 | −3.683041e−24 |
| C6 | 2.525531e−30 | −4.886557e−31 | 5.993731e−30 | 2.331163e−28 |
| C7 | 6.070121e−36 | 5.284852e−36 | −6.235738e−34 | −8.136306e−33 |
| C8 | −9.848310e−40 | 3.056734e−41 | 1.667827e−38 | 1.346431e−37 |
| C9 | 0.000000e+00 | 0.000000e+00 | 0.000000e+00 | 0.000000e+00 |

TABLE 11

NA = 1.43; field size 26 mm * 4 mm; λ = 193 nm

| Surface | Radius | | Thickness | Material | Index (193 nm) | ½ Diameter |
|---|---|---|---|---|---|---|
| 0 | 0.000000 | | 33.332248 | AIR | 1.00000000 | 60.000 |
| 1 | 0.000000 | | −0.004263 | AIR | 1.00000000 | 72.779 |
| 2 | 357357.144810 | AS | 46.089360 | SIO2V | 1.56078570 | 76.013 |
| 3 | −417.562806 | | 74.837927 | AIR | 1.00000000 | 81.763 |
| 4 | 280.404005 | | 60.022974 | SIO2V | 1.56078570 | 101.278 |
| 5 | −166.627712 | AS | 0.999622 | AIR | 1.00000000 | 101.071 |
| 6 | 116.529317 | | 38.169032 | SIO2V | 1.56078570 | 71.306 |
| 7 | 405.500190 | | 15.365869 | AIR | 1.00000000 | 60.252 |
| 8 | −238.458946 | | 9.999795 | SIO2V | 1.56078570 | 56.004 |
| 9 | 211.906189 | AS | 10.592661 | AIR | 1.00000000 | 47.114 |
| 10 | 0.000000 | | 0.000000 | AIR | 1.00000000 | 46.365 |
| 11 | 0.000000 | | 2.965376 | AIR | 1.00000000 | 46.365 |
| 12 | 0.000000 | | 9.999570 | SIO2V | 1.56078570 | 48.729 |
| 13 | 0.000000 | | 0.999095 | AIR | 1.00000000 | 53.095 |
| 14 | 251.808655 | | 75.306859 | SIO2V | 1.56078570 | 59.619 |
| 15 | −209.119448 | AS | 19.949752 | AIR | 1.00000000 | 76.307 |
| 16 | 297.229724 | | 41.623543 | SIO2V | 1.56078570 | 91.301 |

TABLE 11-continued

NA = 1.43; field size 26 mm * 4 mm; λ = 193 nm

| Surface | Radius | | Thickness | Material | Index (193 nm) | ½ Diameter |
|---|---|---|---|---|---|---|
| 17 | −368.032393 | AS | 17.309640 | AIR | 1.00000000 | 91.926 |
| 18 | −304.574570 | | 9.998928 | SIO2V | 1.56078570 | 86.542 |
| 19 | −1835.490188 | AS | 37.493067 | AIR | 1.00000000 | 85.640 |
| 20 | 0.000000 | | 269.847723 | AIR | 1.00000000 | 88.712 |
| 21 | −193.435450 | AS | — | REFL | 1.00000000 | 156.793 |
| 22 | 230.296849 | AS | 269.847723 | REFL | 1.00000000 | 162.808 |
| 23 | 0.000000 | | 37.496545 | AIR | 1.00000000 | 115.972 |
| 24 | 222.765081 | | 32.374348 | SIO2V | 1.56078570 | 118.274 |
| 25 | 139.308788 | AS | 20.243523 | AIR | 1.00000000 | 111.594 |
| 26 | 504.166848 | AS | 50.121407 | SIO2V | 1.56078570 | 111.843 |
| 27 | −296.072806 | | 9.056420 | AIR | 1.00000000 | 110.445 |
| 28 | −602.578656 | | 9.999975 | SIO2V | 1.56078570 | 97.132 |
| 29 | 93.726568 | AS | 13.818669 | AIR | 1.00000000 | 83.497 |
| 30 | 110.971133 | AS | 9.999545 | SIO2V | 1.56078570 | 83.171 |
| 31 | 124.632154 | | 62.097682 | AIR | 1.00000000 | 80.656 |
| 32 | −132.174351 | | 11.899629 | SIO2V | 1.56078570 | 81.715 |
| 33 | −40607.350265 | AS | 24.348045 | AIR | 1.00000000 | 102.447 |
| 34 | 1799.174156 | AS | 51.395108 | SIO2V | 1.56078570 | 115.369 |
| 35 | −187.360985 | | 0.997962 | AIR | 1.00000000 | 123.742 |
| 36 | −700.986626 | AS | 65.447368 | SIO2V | 1.56078570 | 144.945 |
| 37 | −188.074155 | | 1.059137 | AIR | 1.00000000 | 150.242 |
| 38 | −5408.105536 | AS | 29.786331 | SIO2V | 1.56078570 | 175.144 |
| 39 | −1608.220868 | | 35.803900 | AIR | 1.00000000 | 175.488 |
| 40 | 202.569243 | | 79.929030 | SIO2V | 1.56078570 | 175.217 |
| 41 | −580676.026640 | AS | 28.659957 | AIR | 1.00000000 | 170.624 |
| 42 | 0.000000 | | 0.000000 | AIR | 1.00000000 | 171.264 |
| 43 | 0.000000 | | −25.369612 | AIR | 1.00000000 | 171.264 |
| 44 | 192.367691 | | 75.692630 | SIO2V | 1.56078570 | 153.859 |
| 45 | 784.958025 | AS | 0.995706 | AIR | 1.00000000 | 148.467 |
| 46 | 127.716618 | | 51.629289 | SIO2V | 1.56078570 | 104.469 |
| 47 | 697.612041 | AS | 0.960830 | AIR | 1.00000000 | 94.717 |
| 48 | 50.984791 | | 43.213390 | SIO2V | 1.56078570 | 47.246 |
| 49 | 0.000000 | | 3.444444 | HINDLIQ | 1.65002317 | 21.011 |
| 50 | 0.000000 | | 0.000000 | | | 15.000 |

TABLE 11A

Aspheric constants

| SRF | 2 | 5 | 9 | 15 | 17 |
|---|---|---|---|---|---|
| K | 0 | 0 | 0 | 0 | 0 |
| C1 | −6.886423e−08 | −5.399934e−09 | 7.670365e−07 | −1.468962e−08 | 2.941498e−08 |
| C2 | 5.485090e−13 | −1.665701e−13 | −1.648448e−11 | 1.288281e−11 | −2.652838e−11 |
| C3 | −1.310182e−15 | 1.141289e−15 | −7.138563e−14 | 1.151797e−16 | 8.340750e−16 |
| C4 | 4.553614e−19 | −2.207616e−19 | 2.971898e−17 | −1.481358e−19 | 8.678296e−20 |
| C5 | −1.343018e−22 | 2.537949e−23 | −1.082266e−20 | 2.848823e−23 | 1.861559e−23 |
| C6 | 1.960673e−26 | −1.868665e−27 | 5.685298e−24 | −7.123479e−27 | −4.697518e−27 |
| C7 | −1.250480e−30 | 8.263513e−32 | −2.060132e−27 | 9.661060e−31 | 3.445831e−31 |
| C8 | 1.179973e−35 | −1.667241e−36 | 2.897054e−31 | −4.638795e−35 | −8.934923e−36 |
| C9 | 0.000000e+00 | 0.000000e+00 | 0.000000e+00 | 0.000000e+00 | 0.000000e+00 |

| SRF | 19 | 21 | 22 | 25 | 26 |
|---|---|---|---|---|---|
| K | 0 | −1.49741 | −1.62646 | 0 | 0 |
| C1 | 2.476984e−08 | −1.522752e−08 | 1.471219e−08 | −2.496187e−07 | −1.110036e−07 |
| C2 | 1.500487e−11 | −1.396376e−15 | 3.623941e−14 | 9.991017e−12 | 2.261667e−11 |
| C3 | −4.386995e−16 | −1.165187e−18 | −1.591633e−18 | 6.981563e−16 | 1.059597e−16 |
| C4 | 4.006150e−20 | 5.254699e−23 | 2.344572e−22 | −5.968529e−20 | −2.875234e−19 |
| C5 | −2.400161e−23 | −2.875966e−27 | −1.338490e−26 | 4.601373e−24 | 4.467403e−23 |
| C6 | 2.853406e−27 | 8.782897e−32 | 4.654398e−31 | −1.413493e−27 | −4.303454e−27 |
| C7 | −1.087783e−31 | −1.455581e−36 | −8.796362e−36 | 1.323528e−31 | 2.330243e−31 |
| C8 | 4.311181e−37 | 9.964499e−42 | 7.028833e−41 | −3.872736e−36 | −5.208998e−36 |
| C9 | 0.000000e+00 | 0.000000e+00 | 0.000000e+00 | 0.000000e+00 | 0.000000e+00 |

| SRF | 29 | 30 | 33 | 34 | 36 |
|---|---|---|---|---|---|
| K | 0 | 0 | 0 | 0 | 0 |
| C1 | −2.267301e−07 | −8.519491e−08 | 2.440652e−07 | 1.018655e−07 | −3.263771e−08 |
| C2 | −1.583065e−11 | −3.972995e−11 | −2.702153e−11 | −2.093056e−11 | 4.414943e−12 |
| C3 | 6.128819e−15 | 4.407665e−15 | 3.482308e−16 | 1.840200e−15 | −3.226771e−16 |
| C4 | −1.569530e−18 | −6.334167e−19 | 2.746742e−19 | −1.201814e−19 | 1.696874e−20 |
| C5 | 1.407627e−22 | −1.585820e−23 | −4.143028e−23 | 5.796403e−24 | −7.791980e−25 |

TABLE 11A-continued

| | | Aspheric constants | | | |
|---|---|---|---|---|---|
| C6 | −7.921382e−27 | 1.683303e−26 | 3.274508e−27 | −1.854295e−28 | 2.511951e−29 |
| C7 | −3.596221e−31 | −2.727972e−30 | −1.458485e−31 | 3.605510e−33 | −4.563870e−34 |
| C8 | 5.039527e−35 | 1.787510e−34 | 3.028396e−36 | −4.430267e−38 | 3.025968e−39 |
| C9 | 0.000000e+00 | 0.000000e+00 | 0.000000e+00 | 0.000000e+00 | 0.000000e+00 |

| SRF | 38 | 41 | 45 | 47 |
|---|---|---|---|---|
| K | 0 | 0 | 0 | 0 |
| C1 | 9.235685e−09 | 2.984374e−08 | −5.662983e−08 | 4.426415e−08 |
| C2 | −4.548242e−13 | 3.795044e−13 | 5.304155e−12 | −1.939003e−13 |
| C3 | 4.711657e−17 | 2.322935e−17 | −2.666811e−16 | 4.722428e−16 |
| C4 | −6.285778e−22 | −2.741671e−21 | 7.087400e−21 | −3.883053e−20 |
| C5 | −3.584554e−26 | 1.065528e−25 | −2.346928e−26 | −4.947922e−25 |
| C6 | 1.500601e−30 | −1.995489e−30 | −3.324754e−30 | 4.961940e−28 |
| C7 | −2.277407e−35 | 1.285834e−35 | 7.276997e−35 | −4.556416e−32 |
| C8 | 1.311951e−40 | 2.890527e−41 | −3.730749e−40 | 1.483979e−36 |
| C9 | 0.000000e+00 | 0.000000e+00 | 0.000000e+00 | 0.000000e+00 |

TABLE 15

NA = 1.50; field size 26 mm * 5 mm; λ = 193 nm

| Surface | Radius | | Thickness | Material | Index (193 nm) | ½ Diameter |
|---|---|---|---|---|---|---|
| 0 | 0.000000 | | 56.505360 | AIR | 1.00000000 | 61.600 |
| 1 | 0.000000 | | 0.628593 | AIR | 1.00000000 | 84.411 |
| 2 | 0.000000 | | 9.999465 | SIO2V | 1.56078570 | 84.665 |
| 3 | 0.000000 | | 1.018383 | AIR | 1.00000000 | 87.136 |
| 4 | 267.687560 | | 23.051668 | SIO2V | 1.56078570 | 94.506 |
| 5 | 2076.339784 | | 3.011269 | AIR | 1.00000000 | 95.214 |
| 6 | 195.468828 | | 118.243767 | SIO2V | 1.56078570 | 99.907 |
| 7 | 213.465552 | | 65.301393 | AIR | 1.00000000 | 87.739 |
| 8 | 233.154018 | | 24.923341 | SIO2V | 1.56078570 | 92.865 |
| 9 | −1992.179958 | AS | 1.169743 | AIR | 1.00000000 | 91.232 |
| 10 | 397.921478 | | 69.915906 | SIO2V | 1.56078570 | 91.709 |
| 11 | 505.661172 | | 17.194249 | AIR | 1.00000000 | 95.812 |
| 12 | −735.689494 | | 9.999732 | SIO2V | 1.56078570 | 96.173 |
| 13 | 887.983169 | | 8.242783 | AIR | 1.00000000 | 100.163 |
| 14 | 0.000000 | | 0.000000 | AIR | 1.00000000 | 101.571 |
| 15 | 0.000000 | | 42.782393 | AIR | 1.00000000 | 101.571 |
| 16 | −410.552179 | AS | 78.848881 | SIO2V | 1.56078570 | 128.012 |
| 17 | −163.270786 | | 336.654237 | AIR | 1.00000000 | 134.938 |
| 18 | 237.665945 | | 66.291266 | SIO2V | 1.56078570 | 153.690 |
| 19 | −1317.124240 | AS | 86.415659 | AIR | 1.00000000 | 152.243 |
| 20 | 222.206724 | | 27.565105 | SIO2V | 1.56078570 | 112.997 |
| 21 | 921.104852 | AS | 68.984477 | AIR | 1.00000000 | 110.393 |
| 22 | 0.000000 | | 0.000000 | AIR | 1.00000000 | 82.262 |
| 23 | 0.000000 | | −223.984401 | REFL | 1.00000000 | 82.262 |
| 24 | 112.393927 | AS | −9.995120 | SIO2V | 1.56078570 | 93.383 |
| 25 | 618.177768 | | −30.194887 | AIR | 1.00000000 | 110.198 |
| 26 | 180.843143 | | −9.993434 | SIO2V | 1.56078570 | 111.320 |
| 27 | 459.728303 | | −49.418013 | AIR | 1.00000000 | 131.268 |
| 28 | 166.364160 | | 49.418013 | REFL | 1.00000000 | 133.173 |
| 29 | 459.728303 | | 9.993434 | SIO2V | 1.56078570 | 130.248 |
| 30 | 180.843143 | | 30.194887 | AIR | 1.00000000 | 106.184 |
| 31 | 618.177768 | | 9.995120 | SIO2V | 1.56078570 | 102.211 |
| 32 | 112.393927 | AS | 223.984401 | AIR | 1.00000000 | 87.128 |
| 33 | 0.000000 | | 0.000000 | AIR | 1.00000000 | 69.972 |
| 34 | 0.000000 | | −63.976352 | REFL | 1.00000000 | 69.972 |
| 35 | 412.103957 | | −20.679211 | SIO2V | 1.56078570 | 92.437 |
| 36 | 203.153828 | | −0.998595 | AIR | 1.00000000 | 95.263 |
| 37 | −1996.505583 | | −25.026685 | SIO2V | 1.56078570 | 104.114 |
| 38 | 387.517974 | | −0.999117 | AIR | 1.00000000 | 105.544 |
| 39 | −217.409028 | | −35.834400 | SIO2V | 1.56078570 | 112.665 |
| 40 | −1732.046627 | | −89.753105 | AIR | 1.00000000 | 111.738 |
| 41 | −432.227186 | | −24.454670 | SIO2V | 1.56078570 | 100.002 |
| 42 | −429.393785 | AS | −61.820584 | AIR | 1.00000000 | 96.269 |
| 43 | 127.267221 | AS | −9.998963 | SIO2V | 1.56078570 | 96.639 |
| 44 | −354.132669 | | −7.868044 | AIR | 1.00000000 | 110.880 |
| 45 | −523.720649 | | −14.975470 | SIO2V | 1.56078570 | 112.701 |
| 46 | −341.520890 | AS | −0.997791 | AIR | 1.00000000 | 118.281 |
| 47 | −411.353502 | | −48.777625 | SIO2V | 1.56078570 | 120.957 |
| 48 | 342.083102 | | −8.810353 | AIR | 1.00000000 | 122.794 |
| 49 | 514.961229 | AS | −14.987375 | SIO2V | 1.56078570 | 123.090 |
| 50 | 291.403757 | | −79.216652 | AIR | 1.00000000 | 128.222 |

TABLE 15-continued

NA = 1.50; field size 26 mm * 5 mm; λ = 193 nm

| Surface | Radius | | Thickness | Material | Index (193 nm) | ½ Diameter |
|---|---|---|---|---|---|---|
| 51 | 826.480933 | AS | −24.931069 | SIO2V | 1.56078570 | 151.976 |
| 52 | 388.289534 | | −1.073107 | AIR | 1.00000000 | 155.772 |
| 53 | 1460.275628 | | −24.262791 | SIO2V | 1.56078570 | 162.233 |
| 54 | 543.277065 | | −0.999651 | AIR | 1.00000000 | 163.887 |
| 55 | −4320.460965 | | −27.112870 | SIO2V | 1.56078570 | 168.245 |
| 56 | 901.554468 | | −0.999423 | AIR | 1.00000000 | 168.871 |
| 57 | −227.624376 | | −78.149238 | SIO2V | 1.56078570 | 170.522 |
| 58 | −2243.544699 | | −9.897025 | AIR | 1.00000000 | 167.855 |
| 59 | 0.000000 | | 0.000000 | AIR | 1.00000000 | 165.919 |
| 60 | 0.000000 | | −43.822974 | AIR | 1.00000000 | 165.919 |
| 61 | −193.437748 | | −56.826827 | SIO2V | 1.56078570 | 128.975 |
| 62 | 4852.914186 | AS | −1.258966 | AIR | 1.00000000 | 124.642 |
| 63 | −126.542916 | | −25.022273 | SIO2V | 1.56078570 | 89.797 |
| 64 | −202.284936 | AS | −0.996510 | AIR | 1.00000000 | 78.587 |
| 65 | −95.520347 | | −72.724717 | LUAG | 2.10000000 | 70.909 |
| 66 | 0.000000 | | −6.000000 | HIINDLIQ | 1.64000000 | 28.915 |
| 67 | 0.000000 | | 0.000000 | | | 15.401 |

TABLE 15A

Aspheric constants

| SRF | 9 | 16 | 19 | 21 | 24 |
|---|---|---|---|---|---|
| K | 0 | 0 | 0 | 0 | 0 |
| C1 | 1.993155e−07 | 7.648792e−08 | 1.310449e−08 | 1.499407e−08 | −1.140413e−07 |
| C2 | −2.965837e−11 | −1.147476e−12 | −1.473288e−13 | 4.898569e−13 | −1.405657e−12 |
| C3 | 7.084938e−15 | −1.620016e−16 | 1.789597e−18 | −4.831673e−18 | −6.422308e−16 |
| C4 | −1.108567e−18 | 1.291519e−20 | −3.347563e−23 | 5.603761e−22 | 9.595133e−20 |
| C5 | 1.294384e−22 | −4.536509e−25 | 7.855804e−28 | 1.107164e−28 | −1.651690e−23 |
| C6 | −8.666805e−27 | 8.063130e−30 | −1.561895e−32 | −1.720748e−31 | 1.285598e−27 |
| C7 | 2.821071e−31 | −5.992411e−35 | 1.565488e−37 | 3.402783e−35 | −5.054656e−32 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| SRF | 32 | 42 | 43 | 46 | 49 |
|---|---|---|---|---|---|
| K | 0 | 0 | 0 | 0 | 0 |
| C1 | −1.140413e−07 | −4.189168e−08 | −1.685701e−07 | 6.336319e−09 | 5.280703e−08 |
| C2 | −1.405657e−12 | −3.147936e−13 | 9.635698e−12 | 4.071242e−12 | 1.157060e−12 |
| C3 | −6.422308e−16 | −1.294082e−18 | −1.217963e−15 | −3.577670e−16 | −7.824880e−17 |
| C4 | 9.595133e−20 | −2.828644e−22 | 1.012583e−19 | 2.732048e−20 | 7.171704e−21 |
| C5 | −1.651690e−23 | 4.489648e−26 | −8.858422e−24 | −1.655966e−24 | −3.888551e−26 |
| C6 | 1.285598e−27 | −1.468171e−29 | 4.866371e−28 | 6.535740e−29 | −2.007284e−29 |
| C7 | −5.054656e−32 | 1.147294e−33 | −1.337836e−32 | −1.353076e−33 | 4.237726e−34 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| SRF | 51 | 62 | 64 |
|---|---|---|---|
| K | 0 | 0 | 0 |
| C1 | −6.339317e−09 | 4.857833e−08 | −2.139384e−07 |
| C2 | 9.839286e−13 | −8.830803e−12 | 1.525695e−11 |
| C3 | −3.557535e−17 | 7.521403e−16 | −4.799207e−15 |
| C4 | 2.050828e−21 | −4.932093e−20 | 1.286852e−18 |
| C5 | −7.703006e−26 | 2.223792e−24 | −3.670356e−22 |
| C6 | 2.045013e−30 | −5.700404e−29 | 7.133596e−26 |
| C7 | −2.770838e−35 | −3.566708e−35 | −9.239454e−30 |
| C8 | 0.000000e+00 | 4.807714e−38 | 6.969720e−34 |
| C9 | 0.000000e+00 | −1.056980e−42 | −2.499170e−38 |

What is claimed is:

1. A projection objective having an optical axis, the projection objective comprising:

a plurality of optical elements arranged to image an object field arranged in an object surface of the projection objective onto an image field arranged in an image surface of the projection objective, the object field being entirely outside the optical axis of the projection objective, the image field being entirely outside the optical axis of the projection objective, and the optical elements forming:

a first, refractive objective part configured to generate a first intermediate image from radiation coming from the object surface, the first, refractive objective part including a first pupil surface;

a second objective part comprising at least one concave mirror configured to image the first intermediate image into a second intermediate image, the second objective part including a second pupil surface optically conjugated to the first pupil surface; and a third objective part configured to image the second intermediate image onto the image surface, the third object part including a third pupil surface optically conjugated to the first and second pupil surfaces, wherein:

optical elements arranged between the object surface and the first pupil surface form a Fourier lens group that comprises a negative lens group arranged optically close to the first pupil surface;

the Fourier lens group is configured such that a Petzval radius $R_P$ at the first pupil surface satisfies the condition: $|R_P|>150$ mm;

the negative lens group comprises a biconcave negative lens immediately upstream of the first pupil surface along a direction that the radiation propagates through the projection objective; and the projection objective is a catadioptric projection objective.

2. The projection objective according to claim 1, wherein the projection objective is configured to be used in a microlithography projection-exposure system.

3. The projection objective according to claim 1, wherein the negative lens group is a single biconcave negative lens arranged immediately upstream of the first pupil surface along a direction that the radiation propagates through the projection objective so that no positive lens is arranged between the biconcave negative lens and the first pupil surface.

4. The projection objective according to claim 1, wherein the Fourier lens group consists of:

a first positive lens group immediately down-stream of the object surface along a direction that the radiation propagates through the projection objective;

a first negative lens group immediately following the first positive lens group along the direction that the radiation propagates through the projection objective;

a second positive lens group immediately following the first negative lens group along a direction that the radiation propagates through the projection objective; and a second negative lens group immediately following the second positive lens group along the direction that the radiation propagates through the projection objective, the second negative lens group being arranged optically close to the first pupil surface.

5. The projection objective according to claim 1, further comprising an aperture stop positioned at the first pupil surface.

6. The projection objective according to claim 1, wherein the third objective part comprises between the third pupil surface and the image surface in this order along a direction that the radiation propagates through the projection objective:

a front positive lens group;

a zone lens having negative refractive power at least in a peripheral zone around the optical axis of the projection objective; and a rear positive lens group comprising a last optical element of the projection objective immediately upstream of the image surface along a direction that the radiation propagates through of the projection objective.

7. A system, comprising:

an illumination system; and a projection objective according to claim 1, wherein the system is a microlithography projection-exposure system.

8. The projection objective according to claim 1, further comprising a correcting element which is arranged in the first pupil surface or optically close to the first pupil surface.

9. The projection objective according to claim 8, wherein the correcting element is a plane plate having at least one aspheric surface.

10. The projection objective according to claim 8, wherein:

the projection objective is configured to be used in a microlithography projection-exposure system; and when the projection objective is in the microlithography projection-exposure system, the correcting element can be exchanged with another correcting element having a different shape without removing the projection objective from the microlithography projection-exposure system.

11. The projection objective according to claim 8, wherein the correcting element is configured to be moved or tilted relative to a nearest pupil position.

12. A system, comprising:

an illumination system; and a projection objective according to claim 8, wherein the system is a microlithography projection-exposure system.

13. The projection objective according to claim 1, further comprising a correcting element.

14. The projection objective according to claim 13, wherein the correcting element is a plane plate having at least one aspheric surface.

15. The projection objective according to claim 13, wherein:

the projection objective is configured to be used in a microlithography projection-exposure system; and when the projection objective is in the microlithography projection-exposure system, the correcting element can be exchanged with another correcting element having a different shape without removing the projection objective from the microlithography projection-exposure system.

16. The projection objective according to claim 13, wherein the correcting element is configured to be moved or tilted relative to a nearest pupil position.

17. A system, comprising:

an illumination system; and a projection objective according to claim 13, wherein the system is a microlithography projection-exposure system.

* * * * *

UNITED STATES PATENT AND TRADEMARK OFFICE
CERTIFICATE OF CORRECTION

PATENT NO. : 8,780,441 B2
APPLICATION NO. : 13/226615
DATED : July 15, 2014
INVENTOR(S) : Aurelian Dodoc It is certified that error appears in the above-identified patent and that said Letters Patent is hereby corrected as shown below:

In the Drawings

Delete Figs. 8, 13 and 17 and substitute therefor Figs. 8, 13 and 17 as shown on the attached pages.

Sheet 8 of 16, FIG. 8, below x-axis, delete "Heigh" insert --Height--.

Sheet 12 of 16, FIG. 13, below x-axis, delete "Heigh" insert --Height--.

Sheet 15 of 16, FIG. 17, below x-axis, delete "Heigh" insert --Height--.

Signed and Sealed this
Third Day of February, 2015

Michelle K. Lee
*Deputy Director of the United States Patent and Trademark Office*